United States Patent [19]

McCormick et al.

[11] Patent Number: 5,744,557
[45] Date of Patent: Apr. 28, 1998

[54] ENERGY-CURABLE CYANATE/ ETHYLENICALLY UNSATURATED COMPOSITIONS

[75] Inventors: Fred B. McCormick, Maplewood; David J. Drath, Woodbury; Ilya Gorodisher, Stillwater; Michael A. Kropp, Cottage Grove; Michael C. Palazzotto, St. Paul; Melville R. V. Sahyun, Maplewood, all of Minn.

[73] Assignee: Minnesota Mining and Manufacturing Company, St. Paul, Minn.

[21] Appl. No.: 78,981

[22] Filed: Jun. 16, 1993

[51] Int. Cl.⁶ .............................. C08L 67/07; C08F 4/42
[52] U.S. Cl. .............. 526/171; 526/131; 526/133; 526/170; 526/222; 526/225; 526/226; 526/328; 526/346
[58] Field of Search .................. 526/170, 171, 526/222, 225, 301, 226, 131, 133, 346, 328

[56] References Cited

U.S. PATENT DOCUMENTS

| | | | |
|---|---|---|---|
| 3,833,404 | 9/1974 | Sperling et al. | 117/63 |
| 4,116,946 | 9/1978 | Jakob et al. | 528/172 |
| 4,223,073 | 9/1980 | Caldwell et al. | 428/422 |
| 4,383,903 | 5/1983 | Ayano et al. | 204/159.16 |
| 4,600,760 | 7/1986 | Hefner, Jr. | 526/262 |
| 4,707,432 | 11/1987 | Gatechair et al. | 430/281 |
| 4,952,612 | 8/1990 | Brown-Wensley et al. | 522/25 |
| 5,086,086 | 2/1992 | Brown-Wensley et al. | 522/25 |
| 5,143,785 | 9/1992 | Pujol et al. | 428/352 |
| 5,212,210 | 5/1993 | Halm | 522/24 |
| 5,215,860 | 6/1993 | McCormick et al. | 430/270 |

FOREIGN PATENT DOCUMENTS

| | | |
|---|---|---|
| 0 306 162 B1 | 3/1989 | European Pat. Off. . |
| 0344 911 A2 | 12/1989 | European Pat. Off. . |
| 4202316 | 7/1992 | Japan . |
| 4202353 | 7/1992 | Japan . |
| 4202354 | 7/1992 | Japan . |

OTHER PUBLICATIONS

J.M.G. Cowie, "Comprehensive Polymer Science", G. Allen & J.C. Bevington, Eds., Pergamon Press, Oxford, 1989, vol. 3, pp. 1–15.

Wagner & Purbrick, *J. Photographic Sci.*, 1981, 29, 230–235.

Bamford & Mullik, *J. Chem. Soc. Faraday I*, 1976, 72, 368–375.

Bamford & Al–Lamee, *J. Chem. Soc. Faraday I*, 1984, 80, 2175–2186, 2187–2197.

*Primary Examiner*—Fred Zitomer
*Attorney, Agent, or Firm*—Lorraine R. Sherman; Philip Y. Dahl

[57] ABSTRACT

A composition of matter including a polymerizable mixture comprising 1 to 99 weight percent of a first monomer and an initiator therefor, the first monomer being one of 1) at least one free-radically polymerizable monomer or 2) at least one cyanate ester monomer, and 99 to 1 weight percent of a second monomer and an initiator therefor, the second monomer being the member of 1) or 2) that is not selected as the first monomer, wherein the curative for the cyanate ester is a transition metal-containing organometallic compound curing agent and the curative for the free-radically polymerizable monomer is a free-radical generating curing agent or a transition metal-containing organometallic compound. The polymeric mixtures are useful, for example, in applications requiring high performance, such as high temperature performance; in composites, particularly structural composites; structural adhesives; vibration damping materials; electronic applications such as printed wiring boards, semiconductor encapsulants and electronic adhesives; photoresists; injection molding and prepregs; protective coatings; tough self-supporting films; and high performance binders. In addition, a curable composition including (1) an ethylenically unsaturated monomer or (2) an ethylenically unsaturated monomer and a cyanate ester monomer, and certain organometallic neutral compounds is useful in the graphic arts.

23 Claims, 1 Drawing Sheet

ENERGY-CURABLE CYANATE/ ETHYLENICALLY UNSATURATED COMPOSITIONS

FIELD OF THE INVENTION

This invention relates to polymeric mixtures and to precursors therefor and to a process for providing durable polymeric mixtures comprising polymerized ethylenically unsaturated monomers in combination with polycyanurates. In yet another aspect, articles comprising the compositions of the invention are disclosed. The polymeric mixtures are useful, for example, in applications requiring high performance, such as high temperature performance; in composites, particularly structural composites; structural adhesives; vibration damping materials; electronic applications such as printed wiring boards, semiconductor encapsulants and electronic adhesives; photoresists; injection molding and prepregs; protective coatings; tough self-supporting films; and high performance binders.

BACKGROUND OF THE INVENTION

Industry is constantly searching for lighter, stronger, and more resistant materials to be used in place of the materials used today. Cyanate ester resins are known for their thermal stability, chemical inertness, solvent resistance, and electrical properties. Thus, more and more uses are being found in a variety of fields which demand high performance materials, such as structural composites, printed wiring boards, semiconductor encapsulants, structural adhesives, injection molding and prepregs, and high performance binders. The high performance characteristics of cyanate ester resins are offset by their brittleness. To expand their utility, several strategies have been pursued to toughen these materials.

Several patents have dealt with curable compositions comprising cyanate ester monomers and ethylenically unsaturated monomers. See, for example, U.S. Pat. Nos. 4,600,760, 4,116,946, and 4,383,903. Catalysts used for cyanate cure are metal salts, such as zinc octoate, cobalt naphthanate, or certain amines. Use of organometallic catalysts was not taught or suggested. No control over morphology was taught in any of the references.

Cyanate ester resins are formed from polyfunctional cyanate monomers. The use of an organometallic compound as thermal and/or photocatalyst for the cure of a cyanate ester resin has been described in U.S. Pat. No. 5,215,860.

Polymerization of ethylenically unsaturated monomers by thermally or photochemically generated free radicals is well known in the art (see J. M. G. Cowie in "Comprehensive Polymer Science", G. Allen and J. C. Bevington, Eds., Pergamon Press, Oxford, 1989, Vol 3, pages 1–15). Typical free radical generators include organic peroxides, onium salts, azo compounds, and carbonyl compounds.

The use of photoreactive organometallic transition metal carbonyl complexes in conjunction with organic compounds, such as organohalo compounds (H. M. Wagner and M. D. Purbrick, *J. Photographic Sci.* 1981, 29, 230) and electron accepting olefins (C. H. Bamford and S. U. Mullik, *J. Chem. Soc. Faraday I* 1976, 72, 368), in free radical curing is known. For example, benzenechromium tricarbonyl with $CCl_4$, has been used to photopolymerize methyl methacrylate (C. H. Bamford and K. G. Al-Lamee, *J. Chem. Soc. Faraday I* 1984, 80, 2175) and styrene (C. H. Bamford and K. G. Al-Lamee, *J. Chem. Soc. Faraday I* 1984, 80, 2187); in both cases, the active initiating species has been shown to be the $CCl_3$ radical and little or no curing occurs in the absence of $CCl_4$.

Gatechair et al. (U.S. Pat. No. 4,707,432) has shown the combination of certain cationic organometallic complexes, such as ferrocenium salts, with α-cleavage photoinitiators, such as acetophenone, to be useful photoinitiator systems for free radical polymerizations. DeVoe and Palazzotto (EPO Publication No. 0 344 911 A2) have further shown that certain cationic organometallic complexes by themselves are useful photoinitiators for acrylic polymerizations.

Cyanate ester resins have been proposed for use in vibration damping. U.S. Pat. No. 4,223,073 describes the use of polycyanurates in "high temperature damping" composites. These are single component systems in that cyanate ester groups are the only polymerizable groups present; thus, little control is possible over morphologies of the cured resin. Damping properties are varied by changing the organic backbones of the polycyanurates and the effective dampers are not based on commercially available resins. Further, the "high temperature damping" appears to refer to temperatures of around 100° C. Japanese Patent Applications 4,202,316, 4,202,353 and 4,202,354 all describe vibration damping materials comprising preformed saturated polyesters and cyanate ester monomers.

U.S. Pat. No. 3,833,404 discloses a viscoelastic layer for use in a damping means for a vibratory part, the layer being an interpenetrating polymeric network (IPN) which is broadly stated to consist essentially of an elastomer and a plastic. The IPN is prepared sequentially where the first component is cured in the absence of the second component which is then added by swelling or combining the two components as latexes. There is no disclosure to simultaneous or sequential formation of the networks in the presence of both components. The networks are independently crosslinked and continuous.

Electronic adhesives based on cyanate ester compositions cured with organometallic catalysts have been described in U.S. Pat. No. 5,143,785. Cyanate esters are combined with preformed thermoplastic polymers, conductive particles, catalysts and coupling agents in a solvent such as tetrahydrofuran and preferably coated on a release liner to provide an adhesive film. Only the cyanate ester component is cured by the organometallic catalyst because the other component is prepolymerized.

SUMMARY OF THE INVENTION

The background art failed to appreciate that simultaneous or sequential polymeric network formation in the presence of both cyanate ester and ethylenically unsaturated components provided benefits in the formed interpenetrating polymer network (IPN) including a fine degree of morphology control.

Briefly, the present invention provides a composition of matter comprising a curable mixture comprising 1 to 99 weight percent of a first monomer and an initiator therefor, the first monomer being one of 1) at least one ethylenically unsaturated monomer or 2) at least one cyanate ester monomer, and 99 to 1 weight percent of a second monomer and an initiator therefor, the second monomer being the member of 1) or 2) that is not selected as the first monomer, wherein the curative for the cyanate ester monomer is a transition metal-containing organometallic compound and the curative for the ethylenically unsaturated monomer is a free radical generating curing agent or a transition metal-containing organometallic compound, said composition being capable of providing an interpenetrating network comprising a semi-phase separated morphology. The unique combination of curatives surprisingly provides the cured mixture with this desirable morphology. The use of two or more independently partially polymerized ethylenically unsaturated monomers is useful in providing the desired morphology.

The curing agents for both monomers independently may be thermally or photochemically activated.

In another aspect, processing methods for controlling the sequence of cure of the components and thereby controlling the morphology, and thus the properties, of the cured composition are provided. The polymer precursors may be cured by a sequential or simultaneous curing process.

This invention provides a method for preparing coated articles containing the cured composition of the invention comprising the steps of:

(a) providing a substrate, (b) coating an energy polymerizable mixture as described above onto at least one surface of said substrate by methods known in the art, such as bar, knife, reverse roll, knurled roll, or spin coatings, or by dipping, spraying, brushing, and the like, with or without a coating solvent, and (c) applying energy (after evaporation of solvent if present) to the article to cause the polymerization of the coating.

This invention also provides shaped articles comprising the polymerizable mixture of the invention. The articles can be provided, for example, by techniques such as molding, injection molding, casting, and extrusion. Applying energy to the mixture causes polymerization and provides the cured shaped article.

In yet another aspect, cured articles comprising the composition of the invention are disclosed.

The compositions are useful, for example, in applications requiring high performance, such as high temperature performance to 350° C. or higher; in composites, particularly structural composites; structural adhesives; photodefinable adhesives; vibration damping materials; electronic applications such as printed wiring boards, semiconductor encapsulants and electronic adhesives; injection molding and prepregs; and high performance binders.

By subjecting the polymerizable compositions of the invention to sequential or simultaneous initiation processes via application of sufficient energy in the form of heat or light, or in any combination thereof, activated curing agents (prior exposed to energy, preferably light) can catalyze cyanate ester trimerization and initiate free radical polymerization. While certain organometallic initiators such as organometallic complex salts will photoinitiate both polymerizations, they are usually not considered extremely efficient free radical photoinitiators, and it is usually more efficient to use a separate free radical initiator to initiate the free radical reaction. In some applications, where improved electrical resistivity is desired, non-ionic organometallic compounds can be useful to initiate both polymerizations. The process requires no means to remove solvents, such as drying ovens, and provides essentially no volatile matter.

In another aspect, the present invention provides a vibration-damping constrained-layer construction which is a laminate of one or more stiff substrates and one or more layers of a tough polymeric mixture according to the present invention comprising a polymerized ethylenically unsaturated monomer and a polymerized cyanate ester monomer to damp vibrations of component parts of a device or structure. The constrained-layer construction is an integral part of, or is affixed by mechanical or adhesive means to a solid article in need of vibration damping. These constructions comprise:

A. a stiff substrate which is any web or sheet preferably having a stiffness of at least 0.40 (relative to stainless steel) that causes it to resonate in response to an internal or external applied force, and B. a layer of viscoelastic polymer which is a polymeric network derived from ethylenically unsaturated monomers and cyanate ester monomers, so that the resulting constrained layer construction has a composite loss factor, tan delta ($\delta$) greater than or equal to 0.04 in the temperature range between −50° and 400° C. and in the frequency range of 0.01 to 100,000 Hz as evaluated by a Seiko DMS 110 Rheometer using a 20 mm flexure fixture.

In a further aspect, the invention provides compositions which behave as curable pressure sensitive adhesives (PSAs). Curing of the ethylenically unsaturated component of the compositions may be accomplished by photochemical or thermal means without substantially affecting the cyanate ester monomers and the cyanate ester component thus remains thermosettable. Parts may be bonded by the tacky nature of such compositions prior to cure of the cyanate ester component which may subsequently be cured. The compositions provide the ease of use and green strength typical of a pressure sensitive adhesive and very high bond strengths which would be unattainable with simple PSA materials.

In another aspect, electronic adhesive materials are provided which are suitable for direct chip attachment and flex circuit attachment. These are 100% solids compositions and are thus free of any processing solvents or solvent residues. These electronic adhesives may include electrically conductive particles to provide conductive or non-conductive adhesives as desired. The adhesives may be tacky or tack-free depending on the application desired.

In another aspect, photodefinable compositions are provided by the polymeric mixtures of the invention. Exposure of photosensitive compositions through a photographic mask allows coatings of these compositions to be patterned in an image of the photomask to provide a photoresist. The photoresist may be an adhesive which may then be bonded to a variety of materials by application of heat and/or pressure. The ability to place adhesive coatings on specific areas of a substrate with high image resolution may greatly simplify the manufacture of electronic devices by surface mounting techniques. The photoresist may also function as a solder mask or a patterned dielectric layer useful in defining microelectronic circuits.

In yet another aspect, curable compositions comprise at least one ethylenically unsaturated monomer and as initiator certain organometallic neutral compounds. These compositions are not prior disclosed. They are useful in the graphic arts.

What is not taught in the prior art, but what is taught in the present invention, is the use of transition metal-containing organometallic compounds and free radical generators for the simultaneous or sequential curing of cyanate monomers in the presence of ethylenically unsaturated monomers to provide polymeric mixtures possessing unique morphologies that are controllably developed thereby, as discussed below. There is need in the art for effective high temperature vibration damping materials.

Advantages of compositions of the present invention include:

solvents are not required, thus 100% solids processing is provided;

morphology of the cured resin can be controllably and reproducibly developed to provide various physical properties from the same combination of monomers by virtue of the processing conditions chosen;

remarkable high temperature stability of acrylate containing compositions is attained by combination with cyanate ester resins;

excellent adhesion to polyimide film is attained;

commercially available resins are preferably used;

uniquely wide temperature and frequency ranges over which the cyanate ester/ethylenically unsaturated compositions are suitable for vibration damping;

individual cyanate ester/ethylenically unsaturated compositions can have unprecedented wide temperature and frequency ranges over which they are suitable for vibration damping;

excellent adhesion to metal, especially steel, as measured by T-peel and overlap shear;

the cyanate ester/ethylenically unsaturated compositions may be cured by a wide variety of combinations of photo and thermal processes.

In this application:

"catalytically-effective amount" means a quantity of catalyst or initiator sufficient to effect polymerization of the curable composition to a polymerized product at least to a degree to cause an increase in the viscosity of the composition;

"cure" and "polymerize" are used interchangeably in this application to indicate a chemical reaction, usually carried out with a catalyst and heat or light, or any combination of the two, in which many relatively simple molecules combine to form a chain-like macromolecule;

"cyanate monomer" or "cyanate ester monomer" are used interchangeably and mean a chemical substance (generally a monomer or oligomer) in which at least one—OCN group is bonded to an organic radical R through the oxygen atom, forming at least one R—OCN bond; at least two—OCN groups are preferred because of commercial availability and formation of optimized polymerized compositions;

"energy-induced curing" means curing by means of any of electromagnetic radiation (ultraviolet and visible), electron beam, and thermal (infrared and heat) means or any combination thereof such as heat and light simultaneously, or in any sequence, e.g., heat followed by light, light followed by heat followed by light, and the like;

"ethylenically unsaturated" means an organic compound containing at least one carbon-to-carbon multiple bond which, on exposure to free radicals, reacts to form hydrocarbon chains; preferred are vinyl compounds and organic acrylates and methacrylates;

"group" or "compound" or "ligand" or "monomer" or "polymer" means a chemical species that allows for substitution or which may be substituted by conventional substituents which do not interfere with the desired product; e.g., substituents can be alkyl, alkoxy, aryl, phenyl, halo (F, Cl, Br, I), cyano, nitro, etc.;

"organometallic compound" means a chemical substance (ionic salt or neutral compound) in which at least one carbon atom of an organic group is bonded to a transition metal atom ("Basic Inorganic Chemistry", F. A. Cotton, G. Wilkinson, Wiley, N.Y., 1976, p 497);

"IPN" refers to interpenetrating networks wherein all the components are homo crosslinked and physically interlocked and to semi-interpenetrating networks wherein only some of the components are crosslinked;

"partially polymerized syrup" and "syrup" mean a composition comprising at least one partially polymerized monomer; and "radiation sensitive" means may be polymerized or crosslinked by actinic radiation (UV and visible) or electron beam.

While not being bound by theory, it is believed that compositions comprising preferred ratios of ethylenically unsaturated monomer(s), cyanate ester monomer(s), and initiator system(s) allows formation of a multiphase material with high levels of mixing of the two polymers. Some polymeric compositions will form a semi-interpenetrating polymer network (semi-IPN); some systems a true IPN. Other polymeric compositions will form phase separated morphologies of various domain sizes. Existence of the multiphase structure provides improved toughness and may provide increased strength. Selection of monomers, curing agents, and processing conditions provides means of controlling morphologies of the cured compositions of the invention.

BRIEF DESCRIPTION OF THE DRAWING

In the accompanying Drawing.

DETAILED DISCLOSURE OF PREFERRED EMBODIMENTS OF THE INVENTION

Figure 1:
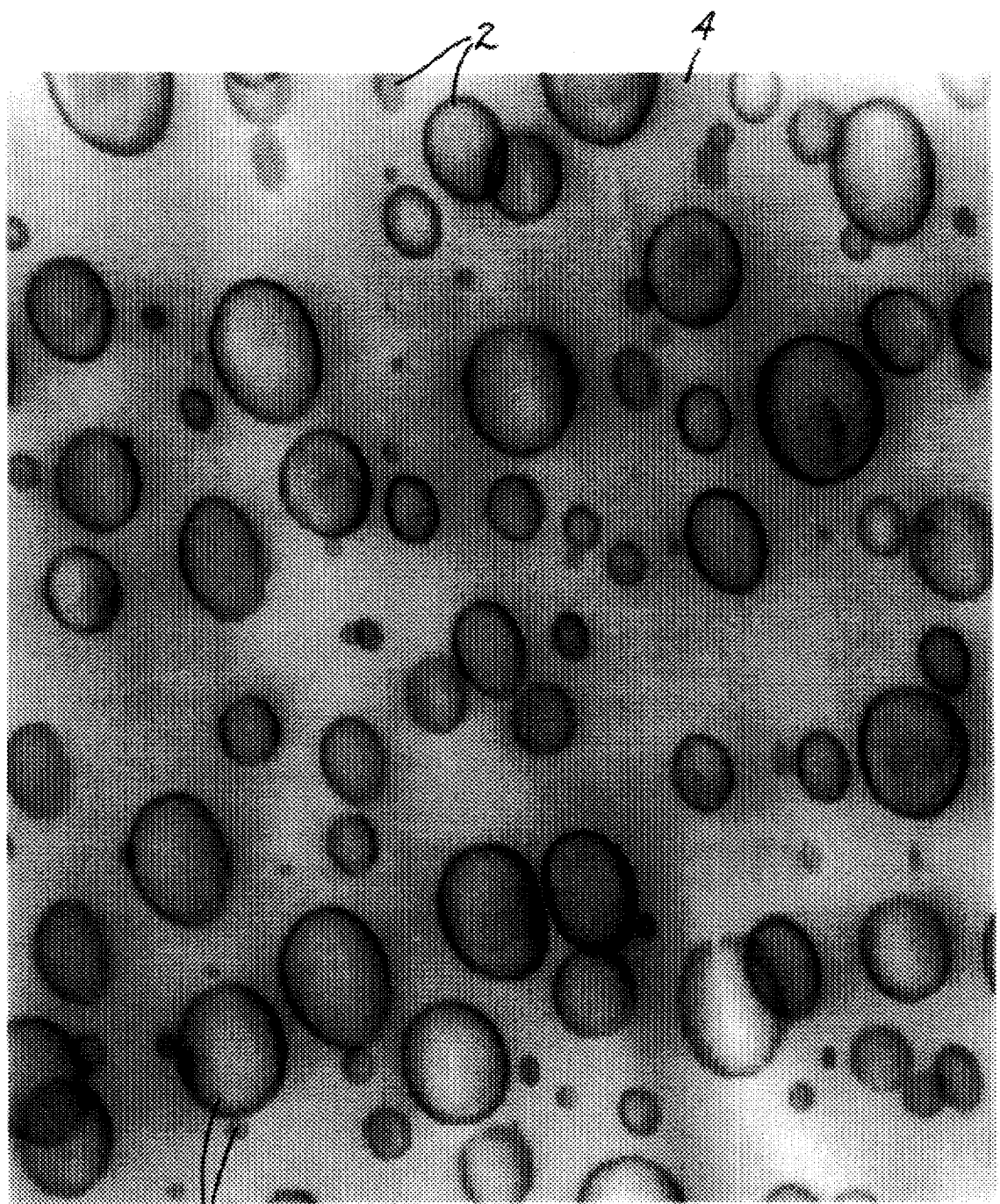
FIG. 1 is a transmission electron micrograph of the invention showing a semi phase separated morphology.

The present invention provides, in a preferred embodiment, a polymerizable composition comprising in the range of 70 to 30 weight percent (more preferably in the range of 60 to 40 weight percent) of at least one cyanate monomer and an organometallic curing agent therefor and in the range of 30 to 70 weight percent (preferably 40 to 60 weight percent) at least one free radically polymerizable ethylenically unsaturated monomer and a curing agent therefor. The curing agents for the cyanate monomers and the curing agents for the free radically polymerizable ethylenically unsaturated monomers may be independently thermally or photochemically activated. The curing agent for the cyanate monomers comprises a transition metal-containing organometallic compound having the structure

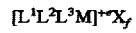   I wherein $L^1$ represents none, or 1 to 12 ligands contributing pi-electrons that can be the same or different selected from acyclic and cyclic unsaturated compounds and groups and carbocyclic aromatic and heterocyclic aromatic compounds, each capable of contributing 2 to 24 pi-electrons to the valence shell of M;

$L^2$ represents none, or 1 to 24 ligands that can be the same or different contributing an even number of sigma-electrons that can be selected from mono-, di-, and tri-dentate ligands, each donating 2, 4, or 6 sigma-electrons to the valence shell of M;

$L^3$ represents none, or 1 to 12 ligands that can be the same or different, each contributing no more than one sigma-electron each to the valence shell of each M;

M represents 1 to 6 of the same or different metal atoms selected from the elements of Periodic Groups IVB, VB, VIB, VIIB, and VIII (commonly referred to as transition metals);

e is an integer having a value of 0, 1 or 2, such that the organometallic portion of the compound is neutral, cationic or dicationic;

each X is provided by organic sulfonates, halogenated metals or metalloids, or alkylated or arylated metal or metalloid, such as tetraalkyl borates or tetraaryl borates. Examples of such ions are B(C$_6$H$_5$)$_4^-$, CH$_3$SO$_3^-$, CF$_3$SO$_3^-$, C$_6$H$_5$SO$_3^-$, AsF$_6^-$, SbF$_6^-$, FeCl$_4^-$, SnCl$_5^-$, SbF$_5^-$, AlF$_6^-$, GaCl$_4^-$, InF$_4^-$, TiF$_6^-$, SbF$_5$OH$^-$, SbCl$_6^-$, and related isomers and the like, and those in which X has the formula DZ$_r$, wherein D is a metal from Groups IB to VIII or a metal or metalloid from Groups IIIA to VA of the Periodic Table of Elements, Z is a halogen atom, and r is an integer having a value of 1 to 6. Preferably, the metals are copper, zinc, titanium, vanadium, chromium, manganese, iron, cobalt, or nickel and the metalloids preferably are boron, aluminum, antimony, tin, arsenic, and phosphorus. Preferably, the halogen, Z, is chlorine or fluorine. Illustrative of suitable anions are BF$_4^-$, PF$_6^-$, AsF$_6^-$, SbF$_6^-$, FeCl$_4^-$, SnCl$_5^-$, SbF$_5^-$, AlF$_6^-$, GaCl$_4^-$, InF$_4^-$, TiF$_6^-$, etc. Preferably, the anions are CF$_3$SO$_3^-$, BF$_4^-$, PF$_6^-$, SbF$_6^-$, SbF$_5$OH$^-$, AsF$_6^-$, and SbCl$_6^-$; and f is an integer of 0, 1 or 2, the number of anions required to balance the charge e on the organometallic portion of the structure of Formula I;

with the proviso that the organometallic compound contains at least one transition metal-carbon bond; and with the proviso that L$^1$, L$^2$, L$^3$, M, e, X, and f are chosen so as to achieve a stable configuration.

Additional descriptive matter relating to the curing agent of formula I can be found in U.S. Pat. No. 5,215,860, col. 4, line 21, to col. 9, line 21, which is incorporated herein by reference.

Preferred organometallic compounds according to formula I are:

[CpFe(CO)$_2$]$_2$, Mn$_2$(CO)$_{10}$, [CpMo(CO)$_3$]$_2$, [CpW(CO)$_3$]$_2$, Re$_2$(CO)$_{10}$, [CpMo(CO)$_2$PPh$_3$]$_2$, [Cp*Fe(CO)$_2$]$_2$, Fe$_3$(CO)$_{12}$, CpFe(CO)$_2$SnPh$_3$, (CO)$_5$MnSnPh$_3$, Cp(CO)$_3$Fe(1+) PF$_6$(1−), ($\eta^6$-benzene)CpFe(1+) PF$_6$(1−), ($\eta^6$-mesitylene)CpFe(1+) BF$_4$(1−), bis($\eta^6$-mesitylene)Fe(2+) SbF$_6$(1−), (MeCp)Mn(CO)$_3$, CpMn(CO)$_3$, CpFe(CO)$_2$Cl, [(p-cymene)RuCl$_2$]$_2$, ($\eta^6$-benzene)Cr(CO)$_3$, wherein Me is methyl, Ph is phenyl, Cp is $\eta^5$-cyclopentadienyl, Cp* is $\eta^5$-pentamethylcyclopentadienyl, and MeCp is $\eta^5$-methylcyclopentadienyl.

The cyanate monomers that can be polymerized using the curing agent of the present invention contain at least two— OCN groups, and are of the general formula $$Q(OCN)_p \qquad II$$

wherein p can be an integer from 2 to 7, and wherein Q comprises at least one of 1) a di-, tri-, or tetravalent aromatic hydrocarbon group containing 5 to 30 carbon atoms, wherein 1) optionally comprises at least one of 1 to 5 aliphatic or polycyclic aliphatic divalent hydrocarbon groups containing 7 to 20 carbon atoms and 1 to 10 heteroatoms selected from the group consisting of non-peroxidic oxygen, sulfur, non-phosphino phosphorus, non-amino nitrogen, halogen, silicon, and 2) a divalent fluorocarbon group having 3 to 12,500 carbon atoms and 5 to 25,000 fluorine atoms corresponding to formula III:

$$CH_2(CFY)_aB(CFY)_bCH_2 \qquad III$$

where B is 1) a carbon-to-carbon bond, in which case a is an integer of 1 to 30 and b is zero, or 2) B is [(CFY)$_d$O (CFY)$_e$]$_w$, in which case a and b are zero, d and e are integers of 1 to 30, and w is an integer of 1 to 20, or 3) B is (OCF$_2$—CFY)$_g$O(CFY)$_h$O(CFY—CF$_2$O)i, in which case a and b are 1, H is an integer of 1 to 10, and g and i are integers of 1 to 100, or 4) B is [(CF$_2$CH$_2$)$_j$(CF$_2$—CFY)$_k$]$_m$, in which case a and b are integers of 1 to 10, j and k are integers whose ratio j/k is 1/1 to 1/10, m is an integer of 1 to 100, and (CF$_2$CH$_2$) and (CF$_2$—CFY) are randomly distributed units; and where Y is fluorine or perfluoroalkyl of 1 to 10 carbon atoms.

In the practice of this invention, preferably a combination of cyanate monomers is used whereby such combination is comprised of one or more cyanates of Formula II where p is an integer 2 to 7, and optionally one or more monofunctional cyanates (e.g. Formula II where p is one). Examples of cyanates are as follows: cyanatobenzene, 4-cyanatobiphenyl, 4-cumylcyanatobenzene, 1,3- and 1,4-dicyanatobenzene, 2-tert-butyl-1,4-dicyanatobenzene, 2,4-dimethyl-1,3-dicyanatobenzene, 2,5-di-tert-butyl-1,4-dicyanatobenzene, tetramethyl-1,4-dicyanatobenzene, 4-chloro-1,3-dicyanatobenzene, 1,3,5-tricyanatobenzene, 2,2'- or 4,4'-dicyanatobiphenyl, 3,3',5,5'-tetramethyl-4,4'-dicyanatodiphenyl, 1,3-, 1,4-, 1,5-, 1,6-, 1,8-, 2,6-, or 2,7-dicyanatonaphthalene, 1,3,6-tricyanatonaphthalene, bis(4-cyanatophenyl)methane, bis(3-chloro-4-cyanatophenyl)methane, 2,2-bis(4-cyanatophenyl)propane, 1,1,1-tris(4-cyanatophenyl)ethane, 1,1-bis(4-cyanatophenyl)ethane, 2,2-bis(3,5-dichloro-4-cyanatophenyl)propane, 2,2-bis(3,5-dibromo-4-cyanatophenyl)propane, bis(4-cyanatophenyl) ether, bis(p-cyanophenoxyphenoxy)benzene, di(4-cyanatophenyl)ketone, bis(4-cyanatophenyl)thioether, bis (4-cyanatophenyl)sulfone, tris(4-cyanatophenyl)phosphite, and tris(4-cyanatophenyl)phosphate. Also useful are other cyanates as disclosed in U.S. Pat. No. 5,215,860, col. 10, lines 19 to 38, which is incorporated herein by reference.

Essentially, any phenol derivative reactive towards cyanogen halide in the presence of base are within the scope of the invention. It is also well known in the art that cyanate monomers can be partially prepolymerized to yield soluble oligomers. These oligomers may also be used as the cyanate monomers in this invention. Such oligomers are commercially available as B-30™, B-50™, M-20™, M-30™, and T-30™ cyanate ester resins (Ciba-Geigy).

Ethylenically unsaturated monomers useful in the present invention preferably can be selected from acrylate, methacrylate, and vinyl ester functionalized materials and are capable of undergoing free radical polymerization. Of particular use are acrylate and methacrylate materials. They can be monomers and/or oligomers such as (meth)acrylates, (meth)acrylamides, N-vinylpyrrolidone and vinylazlactones as disclosed in U.S. Pat. No. 4,304,705, col. 13, lines 34–68, which is incorporated herein by reference. Such monomers include mono-, di-, or polyacrylates and methacrylates such as methyl acrylate, methyl methacrylate, ethyl acrylate, isopropyl methacrylate, isooctyl acrylate, isobornyl acrylate, isobornyl methacrylate, acrylic acid, n-hexyl acrylate, tetrahydrofurfuryl acrylate, N-vinylcaprolactam, N-vinylpyrrolidone, acrylonitrile, stearyl acrylate, allyl acrylate, glycerol diacrylate, glycerol triacrylate, ethylene glycol diacrylate, diethylene glycol diacrylate, triethylene glycol dimethacrylate, 1,6-hexanediol diacrylate, 1,3-propanediol diacrylate, 1,3-propanediol dimethacrylate, trimethylolpropane triacrylate, 1,2,4-butanetriol trimethacrylate, 2-phenoxyethyl acrylate, 1,4-cyclohexanediol diacrylate, pentaerythritol triacrylate, pentaerythritol tetraacrylate, pentaerythritol tetramethacrylate, sorbitol hexaacrylate, bis[1-(2-acryloxy)]-p- ethoxyphenyldimethylmethane, 2,2-bis[1-(3-acryloxy-2-hydroxy)]propoxyphenylpropane, tris(hydroxyethyl) isocyanurate trimethacrylate; the bis-acrylates and bis-methacrylates of polyethylene glycols of molecular weight average 200–500, copolymerizable mixtures of acrylated monomers such as those disclosed in U.S. Pat. No. 4,652,274, col. 2, line 55 to col. 4, line 68, and acrylated oligomers such as those disclosed in U.S. Pat. No. 4,642,126, col. 4, lines 31–50, which patents are incorporated herein by reference for the portions indicated.

It may be desirable to crosslink the ethylenically unsaturated components of the polymerizable compositions of the invention. Particularly useful as crosslinker compounds are acrylates such as allyl acrylate, glycerol diacrylate, glycerol triacrylate, ethylene glycol diacrylate, diethylene glycol diacrylate, triethylene glycol dimethacrylate, 1,6-hexanediol diacrylate, 1,3-propanediol diacrylate, 1,3-propanediol dimethacrylate, trimethylolpropane triacrylate, 1,2,4-butanetriol trimethacrylate, 1,4-cyclohexanediol diacrylate, pentaerythritol triacrylate, pentaerythritol tetraacrylate, pentaerythritol tetramethacrylate, sorbitol hexaacrylate, bis[1-(2-acryloxy)]-p-ethoxyphenyldi-methylmethane, 2,2-bis[1-(3-acryloxy-2-hydroxy)]propoxyphenylpropane, tris(hydroxyethyl)isocyanurate trimethacrylate; and the bis-acrylates and bis-methacrylates of polyethylene glycols of average molecular weight 200–500.

Organometallic compounds of formula I having one $L^1$ ligand, 1 to 6 $L^2$ ligands, no $L^3$ ligands and one metal M as defined previously (i.e., the organometallic compounds have the formula $[L^1L^2M]$) and wherein e and f of formula I are zero, surprisingly are photocatalysts for the cure of the ethylenically unsaturated monomers of the invention. Illustrative examples include $MeCpMn(CO)_3$, $(C_6H_6)Cr(CO)_3$, $(MeC_6H_5)Cr(CO)_3$, $(MeOC_6H_5)Cr(CO)_3$, $(C_6H_6)W(CO)_3$, $CpMn(CO)_3$, and $Cp*Mn(CO)_3$, wherein Me, Cp, MeCp, and Cp* are as previously defined. As was disclosed in U.S. Pat. No. 5,215,860, this class of organometallic compounds are also catalysts for cyanate ester polymerization. Compositions comprising an ethylenically unsaturated monomer and a cyanate ester monomer using this unique class of organometallic compounds as initiator can be useful as noted herein for these mixed polymer networks.

Other free radical curatives useful for the polymerization of the ethylenically unsaturated monomers include organic peroxides such as benzoyl peroxide and di-t-butylperoxide, azo compounds such as azobisisobutylnitrile (AIBN), benzoin ethers such as benzoin-iso-propyl ether and benzoin-n-butyl ether, acetophenones such as 2,2-diethoxyacetophenone and 2,2-dimethoxy-2-phenylacetophenone, onium salts such as diphenyliodonium and triphenyl sulfonium salts, ketals such as benzildimethyl ketal, benzophenone, isopropylthioxantone, ethyl-4-(dimethylamino)benzoate, and other free radical curatives known to those skilled in the art. The free radical curatives may be photochemically or thermally activated. Preferred thermally activated free radical curatives include azo-t-butane, 2,2'-azobis(2,4,4-trimethyl-pentane) and di-t-butyl peroxide 1,1-di-(t-butylperoxy)-3,3,5-trimethylcyclohexane. Photochemically activated free radical curatives are preferred and of these benzildimethyl ketal (Esacure™ KB1 from Sartomer Company) is most preferred.

It may be desirable, and in some embodiments it is preferred, to partially prepolymerize at least one of the free-radically polymerizable monomers or to prepolymerize at least one of the cyanate ester monomers to aid in processing and to effect changes in the physical properties of the cured compositions.

There are two methods for preparing partially prepolymerized syrups of the ethylenically unsaturated monomers described below as Methods A and B. The methods may be used individually or in combination.

Method A

A first step in the preparation of the syrup is to mix the polymerizable monomers (cyanate ester and ethylenically unsaturated) with a catalytically effective amount of a free radical initiator. Preferably, the free radical initiator is not a crosslinking agent and is generally present in an amount within the range of 0.01 to 5.0% by weight of the polymerizable composition, preferably in the range of 0.02 to 1.0% by weight of the polymerizable composition.

A second step is to apply energy to the polymerizable composition to allow it to polymerize such that the Brookfield viscosity is increased to within a range of 300 to 20,000 centipoise at ambient temperature. Preferably, the viscosity after this step is in the range of 500 to 4000 centipoise. The increased viscosity provides a syrup that is suitable as a coating composition for production of the articles of the invention. The polymerizable composition may be polymerized using any well-known polymerization technique and quenched with air to attain the desired viscosity. By "quenched" is meant to inhibit any polymerization or further polymerization. Preferably, the free radical initiator is a photoinitiator, and the partial polymerization may be stopped at any point by eliminating the irradiation source.

A third step is to mix at least one organometallic compound and any optional stabilizing additives, bireactive monomers, ethylenically unsaturated crosslinkers, adjuvants and additional amounts of the above-identified free radical initiator into the syrup.

A fourth step is to degas the curable compositions under vacuum to remove bubbles, dissolved air, oxygen, and the like. Although it is preferable to do this step just prior to coating, it may be carried out at any time from a few hours to several weeks prior to coating. To insure stability of the degassed curable compositions, it is preferable to keep them from unwanted exposure to light.

Method B

Alternatively, if the ethylenically unsaturated composition is derived from a mixture of one or more alkyl (meth) acrylates, a syrup of the ethylenically unsaturated monomers can be prepared without addition of cyanate ester monomers.

The first step in the alternative method is to mix the ethylenically unsaturated monomers with a catalytically effective amount of a free radical initiator. Preferably, this free radical initiator is not a crosslinking agent and generally is present in amounts in the range of 0.01 to 5.0% by weight of the free radically polymerizable components, and preferably in the range of 0.02 to 1.0% by weight.

The second step is to apply energy to the polymerizable composition and allow it to polymerize such that the Brookfield viscosity is increased to within a range of 300 to 20,000 centipoise at ambient temperature. Preferably, the viscosity after this step is in the range of 500 to 4000 centipoise. The increased viscosity provides a syrup that is more suitable as a coating composition for production of articles of this invention.

The polymerizable composition can be polymerized by any well-known thermal polymerization techniques and quenched with air to attain the desired viscosity. It is preferable to use a photoinitiator as the free radical initiator in this process, such that the partial polymerization may be stopped at any point by elminiating the irradiation source and then quenching polymerization with oxygen. It is preferable to use a low intensity irradiation source in this photochemical process and that the mixture be cooled during irradiation. Low intensity irradiation and cooling minimize gel formation during the syrup making process. By "cooling" is meant to keep the composition at or below room temperature. After quenching the polymerization reaction, optional bireactive monomers, ethylenically unsaturated crosslinkers, adjuvants and additional free radical initiators may be added.

The organometallic catalyst system is then added to at least one cyanate ester monomer. If the organometallic catalyst is not readily soluble, solution can be aided by application of heat. The organometallic catalyst can also be dissolved in a suitable solvent first and then added to the cyanate ester monomer.

It is also permissible to add the optional bireactive monomers, ethylenically unsaturated crosslinkers, adjuvants and additional free radical initiators to this composition.

The syrup and cyanate ester mixture described above are then mixed together. If optional bireactive monomers, ethylenically unsaturated crosslinkers, adjuvants and additional free radical initiators have not been added previously, they may be added at this time. The composition is thoroughly mixed to evenly distribute the components.

The curable compositions are degassed under vacuum to remove bubbles and dissolved air (oxygen). Although it is preferable to do this step just prior to coating, degassing can be carried out at any time from a few hours to several weeks prior to coating. To insure stability of the degassed curable compositions, it is preferable to keep the curable composition from unwanted exposure to light.

The preferred method is to combine two or more ethylenically unsaturated syrups, wherein each syrup is prepared either using Method A or Method B.

Photoinitiators which are useful for partially polymerizing alkyl acrylate monomers without crosslinking, to prepare a partially polymerized syrup, discussed below, include compounds such as the benzoin ethers (such as benzoin methyl ether or benzoin isopropyl ether), substituted benzoin ethers (such as anisoin methyl ether), substituted acetophenones (such as 2,2-diethoxyaceto-phenone and 2,2-dimethoxy-2-phenylacetophenone), substituted alpha-ketols (such as 2-methyl-2-hydroxypropiophenone), aromatic sulfonyl chlorides (such as 2-naphthalenesulfonyl chloride) and photoactive oximes.

As it may be desirable to co-crosslink the ethylenically unsaturated monomers with the cyanate ester monomers, another group of monomers which are useful in compositions of the invention are bireactive monomers which serve as crosslinkers, i.e., those that possess at least one free-radically polymerizable group and one cyanate ester or cyanate ester-reactive functionality. A cyanate ester-reactive functionality is a group or an organic compound capable of reaction with a cyanate ester group such that the two groups become chemically bound to one another. Examples of cyanate ester-reactive functionalities include cyanate ester, alcohol, primary amine, secondary amine, and thiol groups. Such monomers include, for example, hydroxyethyl acrylate, hydroxyethyl methacrylate, hydroxypropyl methacrylate, hydroxybutyl acrylate, 4-cyanatophenyl styrene, and 4-cyanato(allyl)benzene. Bireactive monomers can comprise up to 50 weight percent of the curable composition, preferably they comprise less than 25 weight percent of the curable composition. Most preferably, the compositions are free of bireactive monomers.

Solvents, preferably organic, can be used to assist in dissolving of the photoinitiator system in the ethylenically unsaturated monomers and cyanate ester monomers and as a processing aid. It may be advantageous to prepare a concentrated solution of the organometallic curing agent in a solvent to simplify preparation of the photopolymerizable composition. Representative solvents include polar or nonpolar organic solvents such as propylene carbonate, acetone, sulfolane, methyl ethyl ketone, cyclopentanone, methyl cellosolve acetate, methylene chloride, nitromethane, methyl formate, acetonitrile, gamma-butyrolactone, and 1,2-dimethoxyethane (glyme). In some applications, it may be advantageous to sorb the photoinitiator onto an inert support such as silica, alumina, clays, etc., as described in U.S. Pat. No. 4,677,137, entire document, which is incorporated herein by reference.

In the current state of the art, free radical polymerization preferably is carried out in an inert atmosphere. Any inert atmosphere such as nitrogen, carbon dioxide, helium or argon is suitable. A sufficiently inert atmosphere can be achieved by covering a layer of the polymerizable mixture with a plastic film; for photoactive compositions this should be transparent to ultraviolet radiation to allow irradiating through that film in air. The composition should be kept in low light, or preferably total darkness, in air, vacuum, or inert gaseous atmosphere until ready for polymerization.

The curing agents can be present in the range of 0.01 to 20, preferably 0.1 to 10 weight percent of the total composition.

The present invention also provides a process for the polymerization of a combination of cyanate ester monomers and ethylenically unsaturated monomers, comprising the steps of:

(a) providing at least one cyanate ester monomer and at least one ethylenically unsaturated monomer;

(b) adding to said mixture a catalytically effective amount of a cyanate ester curing agent comprising an organometallic compound and a catalytically effective amount of a free radical curing agent comprising an organic compound capable of generating free radicals (and all permutations of the order of mixing the aforementioned components), thereby forming a polymerizable mixture, and (c) allowing the mixture to polymerize or adding energy to the mixture to effect polymerization.

Where divided, the steps are preferably arranged in the following order. The first step is to mix the ethylenically unsaturated monomer(s) containing a single polymerizable group with an effective amount of a free radical generating curing agent. Any bireactive monomers desired can be added during any step except that cyanate ester-containing bireactive monomers preferably are added in the third step described infra. Preferably, the free-radical initiator does not also function as a crosslinking agent.

The second step is to heat or irradiate the composition, and allow it to polymerize so that the viscosity is increased. This will provide a partially polymerized syrup typically having a Brookfield viscosity of 300 to 20,000 centipoise at room temperature, preferably, from 500 to 4000 centipoise. The increased viscosity provides a syrup that is a more suitable coating composition. If a photoinitiator is used for this process, the partial polymerization may be stopped at any point simply by turning off the irradiation or electron beam source. Alternatively, the syrup can be prepared by conventional thermal polymerization techniques and then quenched with air to attain the desired viscosity. Alternatively, the organometallic initiator may be mixed with an alkyl acrylate monomer and then partially polymerized to form a syrup. The syrup can also be mixed with a viscosity adjusting agent, such as a hydrophilic silica or a thermoplastic resin to obtain a suitable viscosity for coating.

The third step is to mix the cyanate ester-containing bireactive monomer(s) into the syrup created in steps one and two.

The fourth step is to mix the syrup with the cyanate ester monomer(s).

The organometallic initiator, crosslinking agent, and an additional amount of free radical initiator may preferably be added at any time after the second step polymerization. The initiators may be mixed with any component. The finished modified syrup may be coated onto a backing and exposed to energy to complete the polymerization.

Alternatively, the composition may be made by mixing all monomers except the cyanate ester with an effective amount of a free radical initiator, partially polymerizing to increase viscosity, then adding the organometallic curing agent, crosslinking agent, additional free radical initiator, and the cyanate ester, and following up by a sequential or simultaneous initiation process.

In still an additional method, step one can be omitted, and all monomers and crosslinking agent can be mixed with a free radical initiator and an organometallic initiator, and following up by a sequential or simultaneous initiation process.

In one embodiment, it is preferred to combine two or more ethylenically unsaturated polymerizable syrups, wherein each syrup is prepared using any of the methods disclosed herein. Processing to provide high performance compositions is assisted when in the range of 1 to 50 weight percent (or that weight percent present up to the gel point of the composition) of monomers are prepolymerized into a syrup. Preferably, 1to 30 weight percent, and most preferably 1 to 15 weight percent of monomers are prepolymerized.

It may be desirable to add solvent to solubilize components and aid in processing. Solvent, preferably organic solvent, in an amount up to 99 weight percent, but preferably in the range of 0 to 90 weight percent, most preferably in the range of 0 to 75 weight percent, of the polymerizable composition can be used. Most preferably, the polymerizable composition is solvent-free.

In general, thermally induced polymerization of cyanate monomers with organometallic catalysts may be carried out at 80° to 250° C. (preferably 80° to 150° C.). In general, radiation-induced polymerization of cyanate monomers with latent curing agents comprising an organometallic compound can be carried out at 80° to 125° C. for the majority of energy curable compositions, although low temperature (e.g., 25° to 80° C.) or elevated temperature (e.g., 125° to 300° C., preferably 125° to 200° C.) can be used to subdue the exotherm of polymerization or to accelerate the polymerization, respectively. In some instances it is desirable to use a two-stage cure: curing at a low temperature (e.g., 25° to 80° C.) to gel the composition and followed by a high temperature post cure (e.g., above 80° to 300° C.) to develop the final properties of the composition. Temperature of polymerization and amount of catalyst will vary and be dependent on the particular curable composition used and the desired application of the polymerized or cured product. The amount of curing agent to be used in this invention should be sufficient to effect polymerization of the monomers or precursors (i.e., a catalytically-effective amount) under the desired use conditions. Such amount generally will be in the range of about 0.01 to 20 weight percent, and preferably 0.1 to 10.0 weight percent, based on the weight of curable composition.

For those compositions of the invention which are radiation-sensitive, any source of radiation including electron beam radiation and radiation sources emitting active radiation in the ultraviolet and visible region of the spectrum (e.g., about 200 to 800 nm) can be used. Suitable sources of radiation include mercury vapor discharge lamps, carbon arcs, tungsten lamps, xenon lamps, lasers, sunlight, etc. The required amount of exposure to effect polymerization is dependent upon such factors as the identity and concentration of catalysts, the particular cyanate ester and ethylenically unsaturated monomers, the thickness of the exposed material, type of substrate, intensity of the radiation source and amount of heat associated with the radiation.

Thermal polymerization using direct heating or infrared electromagnetic radiation, as is known in the art, can be used to cure polymerizable compositions according to the teachings of this invention.

It is within the scope of this invention to use multiple wavelengths of actinic radiation by irradiating the photopolymerizable compositions sequentially. In the preferred method, photopolymerization is effected by sequential exposure to a radiation source emitting active radiation in the visible region of the spectrum, followed by exposure to a radiation source in the ultraviolet region of the spectrum. It is also preferred to heat either during or after irradiation in the visible region. In addition, it may be desirable to subsequently thermally polymerize the activated precursor so obtained, the irradiation temperatures being below the temperature employed for subsequent heat postcuring. These activated precursors may normally be polymerized at temperatures which are substantially lower than those required for direct thermal polymerization, with an advantage in the range from 50° to 110° C. This process also makes it possible to control polymerization in a particularly simple and advantageous manner.

It is within the scope of this invention to include two-stage polymerization (curing), by first activating curing agent by irradiating the curable compositions and subsequently thermally curing the activated precursors so obtained, the irradiation temperature being below the temperature employed for the subsequent heat-curing. These activated precursors may normally be cured at temperatures which are substantially lower than those required for the direct thermal curing, with an advantage in the range from 50° to 150° C. This two-stage curing also makes it possible to control the polymerization in a particularly simple and advantageous manner.

Adjuvants such as solvents, pigments, abrasive granules, stabilizers, light stabilizers, thermoplastics, antioxidants, flow agents, bodying agents, flatting agents, colorants, inert fillers, binders, blowing agents, fungicides, bactericides, surfactants, plasticizers, conductive particles, and other additives as known to those skilled in the art can be added to the compositions of this invention. These can be added in an amount effective for their intended purpose.

Compositions of this invention may be applied, preferably as a liquid, to coat a variety of substrates including metal such as steel, aluminum, copper, cadmium, and zinc; glass, paper, wood, or various plastic films such as polyimide, poly(ethylene terephthalate), plasticized poly(vinylchloride), poly(propylene), poly(ethylene), and the like, and irradiated. By polymerizing part of the coating, as by irradiation through a mask, those sections which have not been exposed to radiation may be washed with a solvent to remove the unpolymerized portions of the compositions while leaving the photopolymerized, insoluble portions in place. Thus, compositions of this invention may be used in the production of articles useful in the graphic arts such as printing plates and printed circuits. Methods of producing printing plates and printed circuits from photopolymerizing compositions are well known in the art (see for example British Patent Specification No. 1,495,746).

The present invention composition can have utility as a vibration damping material. Properties of vibration-damping materials are described in the literature. Nielsen, L. E., *Mechanical Properties of Polymers*, Van Nostrand Reinhold: New York, 1965; pp 162–165, discloses that materials possessing the maximum vibration-damping capability have shear storage moduli, G', greater than $10^7$ dynes/cm$^2$ but less than $10^{10}$ dynes/cm$^2$ at the use temperature. Furthermore, Rosen, S. L., *Functional Principles of Polymeric Materials for Practicing Engineers*; Barnes and Noble: New York, 1971; pp 222–227, shows that it is desirable for a vibration-damping material to have both a storage modulus and a loss tangent with values as high as possible.

Yerges, L. F., *Sound, Noise, and Vibration Control*; Van Nostrand Reinhold: New York, 1965; pp 68–69, notes that useful damping materials exhibit decay rates from as low as 5 to 80 dB/sec (decibels/second), and from ½ to 20 percent of critical damping. ("Critical" damping is the damping necessary to just prevent oscillation).

Damping materials are applied to structures and component parts in devices to attenuate resonant vibrations and thereby reduce noise and vibrational fatigue. This is often accomplished by attaching a viscoelastic material of appropriate damping characteristics to the vibrating structure. The vibrational forces cause the viscoelastic material to undergo deformation where some of its inelastic deformation energy is converted to heat and then dissipated (mechanical hysteresis). Under cyclic loading, the heat generated results in a temperature rise until the heat generated per cycle is equal to the heat dissipated through conduction, convection and radiation. Thus, the ability of a material to damp is measured by its ability to convert vibrational energy to heat energy.

In viscoelastic materials, the maximum amount of energy is dissipated as heat at the glass-rubber transition temperature. The effectiveness of a viscoelastic material in energy dissipation can be evaluated by measuring its viscoelastic response to a periodic stress or strain. When a polymeric material is subjected to a periodic stress, the degree of polymer viscoelasticity will be reflected in the amount of the viscous lag between the imposed stress wave and the induced strain wave. The Youngs Modulus, E*, of a material is a complex number, given by the sum of the storage and dissipation (or loss) terms: E*=E'+iE". The dissipation term, E", is a measure of how much energy a material can damp or dissipate. The shear modulus, G*, is similarly defined as G*=G'+iG". The lag, known as δ, is the measure in degrees of how much out of phase the stress and strain are. The tangent of δ, frequently referred to as the dissipation (or loss) factor, is defined by the ratio of the loss modulus to the storage modulus: tan δ=E"/E' or tan δ=G"/G'. Polymers in their glassy state or in their rubbery plateau have a negligible lag, while viscoelastic materials in the glass transition regime could have a large energy dissipation contribution to the modulus, and thus have a large tan δ. Results of dynamic mechanical analysis (DMA) tests are generally given in terms of the storage modulus, E' or G', the loss modulus, E" or G", and tan δ. Tan δ is a damping term and is a measure of the ratio of energy dissipated as heat to the maximum energy stored in the material during one cycle of oscillation. The morphologies of cured resin compositions of the invention are reflected by the shape of the tan δ, E', E", G', or G" curves obtained by DMA; a single phase system gives a single tan δ peak while a multiphase system will give multiple tan δ peaks.

The glass transition range of a two (or more) component (meth)acrylate blend can be broadened by causing phase separation between the components before final polymerization. This can be done by making oligomeric solutions (syrups) of each component, to a certain degree of polymerization, then by mixing of the solutions some immiscibility will occur causing the desired phase separation. Immiscibility will occur due to thermodynamic considerations discussed below.

IPNs and semi-IPNs are attractive classes of materials because they have a potential of offering toughened high performance materials with superior adhesive (up to at least 800 g/mm$^2$ shear value) properties from the common and inexpensive polymers and monomers. IPNs have the ability to provide materials with vastly different properties and performance using the same starting components via the variation of the ultimate IPN morphology. Morphology describes the micro and macro molecular architecture, i.e., how intimately the components are mixed on a continuum of size scales. The ability to control this IPN morphology provides for high performance polymers at low cost.

The degree of mixing of polymers in an IPN, or the degree and scale of their phase separation may define the properties of that IPN. Typically, high polymers are highly immiscible due to the entropic considerations; simple blends of pre-formed polymers usually results in highly phase separated morphologies. The present invention provides the means for simultaneous or sequential formation of IPNs by in situ polymerization of mixtures of monomers; thermodynamically incompatible polymers can in this way be compatibilized by the kinetic routes of the invention described below.

The degree of phase separation (relates to number and size of different phase compositions) in the thermodynamically incompatible IPNs of the invention can be controlled by two key rates; 1) the rate of polymerization or crosslinking of each component and 2) the rate of diffusion of each polymer. Thermodynamics is driving the system to phase separate at the diffusion rate, while kinetics inhibits phase separation by physically interlocking the forming polymer networks through the polymerization and crosslinking reactions. Assuming that the monomeric mixture is a true solution, the degree of incompatibility of the two polymers forming the IPN progressively grows with the increasing molecular weight due to thermodynamic considerations. But at the same time, the increasing molecular weight translates into an increasingly interlocked and intertwined networks of the component polymers. These mechanical interlocks hinder the extensive phase separation of the incompatible networks.

Thus, in a two component system where the polymerized components are incompatible, if the polymerization rate is much faster than the diffusion rate, then the growing polymers will not have time to phase separate and will end up "trapped together" at the gel point. Such IPNs will favor the fully miscible morphology of an idealized IPN. The tan δ curve from DMA a such a material will tend to show a single, fairly narrow peak at a temperature which is between the glass transition temperatures of the two component homopolymers and may be calculated by the Fox equation (see L. H. Sperling, "Introduction to Physical Polymer Science", John Wiley & Sons, Inc., New York, 1992, pp 357–360).

In the opposite case where the polymerization is much slower than the diffusion rate, the growing polymers have enough time to phase separate and end up forming a phase separated IPN structure. The tan δ curve from DMA a such a material will tend to show two fairly narrow peaks, one each at a temperature near to the glass transition temperatures of the two component homopolymers.

In the case where the polymerization rate is similar to the diffusion rate, the growing polymers will undergo some phase separation and some phase mixing to give a semi-phase separated or microheterogeneously phase separated IPN structure which is intermediate between the first two cases. The semi-phase separated or microheterogeneously phase separated IPNs are defined as those which incorporate a multitude of phase compositions ranging from pure low Tg component to pure high Tg component and their various mixtures. The tan δ curve from DMA of such a material will tend to show one very broad peak roughly spanning the temperature range between the glass transition temperatures of the two component homopolymers.

While not wanting to be bound by theory, the semi-phase separated or microheterogeneously phase separated IPNs are the ideal morphology choice for vibration dampers with broad operating temperature ranges. Wide temperature damping in semi-phase separated IPNs is a result of an aggregate molecular architecture consisting of a continual spectrum of compositions, ranging from pure low Tg component to the pure high Tg component.

The morphology comprised of a continuum of phase compositions is characteristic of an IPN formed under mixed kinetic control conditions. A system that either started out under the polymer growth control and later crossed over to the diffusion control, or visa versa, would encounter a regime of mixed controls in between. The degree of the allowed phase separation continually changes in the IPN formation during the change of the controls. Variable amounts of each component are allowed to diffuse in and out of the domains that are in the process of becoming discrete microheterogeneous phases. It is during this time that the phases with a wide range of variable compositions are formed. The desired semi-phase separated morphology may also be defined as a cured or partially cured composition in which tan δ, as measured by DMA in the constrained layer mode, is at least 0.03 over 20% or more of the temperature range between the Tg of the pure high Tg component and the Tg of the pure low Tg component.

FIG. 1 is a transmission electron micrograph of a polymerized mixture comprising a combination of isooctyl acrylate, isobornyl acrylate, cyanate ester Quatrex-7187, and as curative [CpFe(CO)$_2$]$_2$ and benzoin dimethylketal which shows a semi phase separated IPN structure 10. Microheterogeneous phases of polymerized cyanate ester-acrylate regions 2, which are cyanate ester rich, are incorporated in polymerized acrylate-cyanate ester region 4, which is acrylate rich, and provides high performance properties to the IPN. The cyanate rich regions have been stained with ruthenium tetroxide to enhance their visibility.

The control over the morphology of an IPN is a result of the ability to control the rates of diffusion and polymerization. Partial prepolymerization of components, individually or together, provides additional control of these rates. The control is multi-fold: the rates can be varied by the choice of materials, processing and catalytic systems. The materials choice can vary the viscosity or the rigidity of the polymerizing composition via the degree of cross-linking and the Tgs of the selected individual components. Compositions of different viscosities provide differing barriers to both diffusion and propagation.

Processing can greatly vary the rates by simply changing the order in which the IPN components are polymerized. The energy used to cure the components can be adjusted to affect the rates. Thermal cure can be substituted for the photoactivated polymerization to change the pace of the polymerization. Processing can be used to adjust the amount of time which passes between the initiation of each cure, thus allowing greater degree of diffusion and therefore, phase separation.

Choice of catalysts or initiators and amount used can have a profound effect on the polymerization and its speed. The organometallic catalysts used for cure of the cyanate component of compositions of this invention also initiate some degree of cure of the ethylenically unsaturated monomers. This ability to cause some simultaneous cure of both components with one catalyst can be a key feature in the development of the microheterogeneously phase separated IPNs of this invention. Additives can be used to delay or speed up cure of the polymer.

As is known in the art, the most efficient use of a damping material occurs if the material is sandwiched between the panel to be damped and a relatively stiff layer, such as a thin metal sheet. This forces the damping material into shear as the panel vibrates, dissipating substantially more energy than when the material acts simply in extension and compression.

Solid articles comprising viscoelastic polymeric mixtures of the invention are prepared by either of two processes. In a first process, a layer of the polymerizable mixture is coated onto a release liner, the mixture is polymerized, and the layer of resulting polymeric mixtures transferred to a substrate and adhered thereto, thereby providing a constrained-layer construction. In the second process, a layer of the polymerizable mixture is coated directly onto a substrate and the mixture polymerized in situ thereby also providing a constrained-layer construction. The constrained-layer construction is then mechanically (e.g., as by bolting) or adhesively affixed to a solid article that requires vibration damping. Alternatively, the vibration damping layer may be an integral part of the article requiring damping, such as an automotive body panel or a disc brake pad assembly. When the solid article subsequently vibrates under the influence of an internal or external applied force, vibration in the solid article is damped.

Since the viscoelastic polymer often has adhesive properties, the polymer can usually be adhered to a stiff layer or substrate without the use of an adhesive. It is sometimes desirable, however, to use a thin layer (e.g., 20–50 µm) of high-modulus adhesive, such as an acrylic adhesive or an epoxy adhesive, to bond the polymer to a solid article which can be, for example, an oil pan, a valve cover, or a transmission housing.

As mentioned above, a stiff layer or substrate is an essential part of the constrained-layer vibration-damping constructions of the present invention. A suitable material for a substrate has a stiffness of at least 0.40 (relative to stainless steel) as defined in *Handbook of Tables for Applied Engineering Science*, Bolz, R. E. et al., eds., CRC Press: Cleveland, Ohio, 1974, p 130. The desired stiffness of the substrate is varied by adjusting the thickness of the layer, for example from about 25 micrometers to 5 centimeters, depending on the modulus of the substrate. Examples of suitable materials include metals such as iron, steel, nickel, aluminum, chromium, cobalt and copper, and alloys thereof and stiff polymeric materials such as polystyrene, polyvinylchloride, polyurethane, polycarbonate, and polyepoxide, glass fiber-reinforced plastics such as glass fiber, ceramic fiber, and metal fiber-reinforced polyester, glasses, and ceramics. The process for polymerization of the composition may be completed in one step, or may be divided into several steps separated by an interval of time, where such is preferable.

Vibration damping materials of this invention are particularly useful in high temperature applications and in applications requiring damping over very broad temperature ranges. Damping from less than 0° C. to over 300° C. are possible with single compositions of this invention.

The cyanate ester/ethylenically unsaturated compositions of this invention exhibit improved thermal stability, surviving multi-hour exposures to 260° C. The damping ability of some compositions improved upon repeated thermal cycling to 300° C. The effective damping range of the compositions of this invention are easily adjusted changing the morphology of the cured compositions; this is controlled by choice of monomers, catalysts, and processing conditions. For example, by varying the relative amounts of the low Tg acrylate in the composition, the Tg range of the ultimate IPN can be shifted.

The wide temperature damping range and excellent thermal stability of the compositions of this invention make these materials useful as sound dampers for automotive brake shoes. Such applications typically require damping from ambient temperatures to about 150° C. combined with the ability to withstand 260° C. for two hours. The action of the brake piston during the braking requires the polymeric damper constrained between metal plates to withstand over 350 g/mm² (500 lb/in²) in shear. Mass production of such constrained layer geometries further requires solution coating or tape laminating of the damping materials onto a metallic sheet that is wound into a coil. The constrained layer damping construction desirably has a T-peel adhesion exceeding 90 g/mm (5 lb/in) in order to resist degradation during these winding processes. Cyanate ester/acrylate compositions are preferred for these types of rigorous applications. The fine degree of control over intermediate and final morphologies allows a room temperature viscoelastic material to have semistructural overlap shear, excellent thermal stability, and good T-peel adhesion. For a brake shoe damper, the best morphology is obtained by a three step process; a short thermal cure, followed by a photocure, with a final thermal cure at a higher temperature than the initial thermal cure. The preferred cyanate resin is Quatrex-7187™ (Dow Chemical Co.), the preferred acrylate is a mixture of isobornyl acrylate syrup and isooctyl acrylate syrup, and the preferred curatives are benzildimethyl ketal and [CpFe(CO)₂]₂.

For most applications, the layer of viscoelastic polymer is a coating having a thickness of at least 0.01 mm up to about 100 mm, preferably 0.025 to 100 mm, and most preferably 0.05 to 100 mm. The coating can be applied by any of the techniques known in the art such as by spray, dip, knife, or curtain coating.

The polymerizable (curable) mixtures of the invention can be used to provide a pressure sensitive adhesive, which when coated onto a flexible backing provides a tape, or when the flexible backing has release properties there is provided a transfer tape.

The adhesives of the invention useful in electronic applications (referred to as electronic adhesives) may be produced by combining an effective amount (preferably 20 to 80 weight percent, more preferably 30 to 70 weight percent, and most preferably 40 to 60 weight percent of the total composition) of a cyanate ester monomer or oligomer, a curing catalyst for the cyanate ester, an effective amount (preferably 80 to 20 weight percent, more preferably 70 to 30 weight percent, and most preferably 60 to 40 weight percent of the total composition) of an ethylenically unsaturated monomer or prepolymer, a free radical generating curative, and various desirable additives such as electrically conductive particles, thermoplastics, and coupling agents. Combinations of cyanate ester resins and ethylenically unsaturated resins (monomers or partially polymerized resins) are chosen such that a homogeneous solution is obtained which has a viscosity suitable (preferably 300 to 20,000 cps, most preferably 500 to 4000 cps) for coating operations. The catalyst system of organometallic curative and free radical generators may be activated thermally or photochemically or in any combination. It is preferred that one of the catalysts be photochemically activated and the other be thermally activated. Most preferably, the cyanate ester curative is a thermally activated catalyst such as [CpFe(CO)₂]₂, wherein Cp is cyclopentadienyl, and the free radical generator is a photoactive material such as benzildimethyl ketal. The adhesive can be coated by standard techniques between two release liners, such as polypropylene or silicone treated polyester, and the ethylenically unsaturated resin is cured by the application of heat or, preferably, light to give an adhesive film wherein the cyanate ester portion remains as a thermosettable resin. When the ethylenically unsaturated resin component of the film is photochemically cured, at least one of the release liners must be transparent to the wavelength of light used to effect the cure. Alternatively, the compositions may be coated onto a single release liner and thermally or photochemically cured under an inert, oxygen free atmosphere such as nitrogen. It is preferred that no solvents are used in the coating and processing of the electronic adhesive of the invention. In use, the adhesive film, which may be tacky or non tacky depending upon the resins chosen, is placed between the surfaces to be bonded, such as flex circuitry and printed circuit boards, and laminated by the application of heat and pressure. Electrical contact may be made by metallic features on the substrates to be bonded which protrude through the adhesive film during the bonding step (as with a "bumped" chip). Alternatively, the adhesive can be loaded with electrically conductive particles as described in U.S. Pat. No. 5,143,785, col. 7, line 58 to col. 8, line 15, which is incorporated herein by reference, such that no electrical conductivity is possible in the plane of the film but electrical conductivity is provided through the thickness of the film; such materials are referred to as Z-axis Films (ZAF). Any of several electrically conductive particle types may be used in the invention and are selected based on the intended application. Examples of useful particle types include metalized plastic spheres, solid metal particles, precious metal coated metal particles, solder particles and graphite powders. Particles having diameters in the range of 2–30 micrometers are preferred with 10–20 micrometer diameters being most preferred. Particle loadings in the range of 1–25% by volume of the adhesive are preferred with 2–10% as the most preferred range. Acrylates are the preferred ethylenically unsaturated monomers and isooctyl acrylate, isobornyl acrylate, phenoxyethyl acrylate, butyl acrylate, 2-(2-ethoxyethoxy)ethyl acrylate, cyclohexyl acrylate, tetrahydrofurfuryl acrylate, and hexyl methacrylate are particularly useful. Because polyimide flex circuitry is of great importance in the electronics industry, adhesion to polyimide is critical. It is thus desirable to incorporate acrylates containing basic or nitrogenous functionality such as dimethyl acrylamide, N-vinyl caprolactam, butyl carbamoyl ethyl acrylate, t-octyl acrylamide, N-iso-butoxymethyl acrylamide, cyclohexylmaleimide, and N-t-butylacrylamide into the electronic adhesive compositions to promote adhesion to polyimide substrates. It may also be desirable to incorporate di- or polyfunctional acrylates such as 1,6-hexanediol diacrylate, neopentyl glycol diacrylate, pentaerythritol tetraacrylate, pentaerythritol triacrylate, urethane acrylate CN 962™ from Sartomer Co., urethane methacrylate CN 974™ from Sartomer Co., epoxy acrylate CN 104™ from Sartomer Co., and polybutadiene diacrylate to partially crosslink the acrylate portion of the composition. Preferred cyanate ester resins are bisphenol based materials such as B-10™, B-30™, L-10™, M-20™, and RTX-366™ all available from Ciba-Geigy, polycycloaliphatic derivatives such as Quatrex-7187™ available from Dow Chemical, and cyanated novolak resins such as Primaset™, PT-30™, PT-60™, and PT-90™ available from Allied-Signal Corporation. Preferred cyanate ester resins include B-30™, M-20™, RTX-366™ (all available from Ciba-Geigy) and Quatrex-7187™ (Dow) is most preferred. The relative amounts of cyanate ester resin and ethylenically unsaturated resin used in the electronic adhesive will determine the properties of the adhesive. Combined amounts of cyanate ester resin and polyfunctional ethylenically unsaturated resin in the range of 20 to 70 percent by weight will provide reworkable bonds, that is bonds which may be debonded by application of heat followed by solvent treatment without damage to the electronic components such that the parts can be rebonded and electrical contact established, and high levels of cyanate ester resins will provide permanent bonds. Preferably combined amounts of cyanate ester resin and polyfunctional ethylenically unsaturated resin are present in the range of 30 to 60 weight percent. Properties of the electronic adhesives are dictated by the application for which they are intended.

Other additives such as coupling agents, inert fillers, and thermoplastic resins may be included for their intended purposes, generally in amounts up to 50 weight percent.

Since the ethylenically unsaturated portion of the compositions of the present invention can be cured substantially independent of the cyanate ester portion, it is possible to prepare curable pressure sensitive adhesives with these compositions. Acrylates are particularly useful as the ethylenically unsaturated monomer when preparing curable pressure sensitive adhesives. The ethylenically unsaturated monomer(s) and cyanate ester monomer(s) are chosen such that upon cure of the ethylenically unsaturated monomer, a tacky film is obtained. A non-tacky film could also be used provided it becomes tacky at elevated temperatures where it can then be applied to the surfaces to be bonded. The films may be free standing, coated on a release liner, or coated on a backing such as paper, cloth, polymer, or metal. This may then be used to bond two substrates together by the PSA nature of the composition, subsequent application of energy, preferably heat, cures the cyanate ester portion to provide a bond of higher strength than the bond containing uncured cyanate ester resin. The compositions offer the convenience of a PSA while ultimately providing very high bond strengths not typically available from a standard PSA. Acrylates which are particularly useful in curable PSA compositions of this invention include isooctyl acrylate, isobornyl acrylate, phenoxyethyl acrylate, butyl acrylate, 2-(2-ethoxyethoxy)ethyl acrylate, cyclohexyl acrylate, tetrahydrofurfuryl acrylate, and hexyl methacrylate and various combinations thereof. Cyanates which are particularly useful in curable PSA compositions of this invention include B-10™, B-30™, B-50™, T-30™, M-10™, M-20™, L-10™, RTX-366™, Quatrex-7187™, and Primaset™ PT-30™, PT-60™, and PT-90™ and various combinations thereof. The curable PSA compositions may contain 5–95% cyanate ester monomer and 95–5% acrylate monomer. Preferred compositions contain 20–80% cyanate and 80–20% acrylate by weight, and the most preferred compositions contain 35–65% cyanate and 65–35% acrylate by weight. In an alternative method, the cyanate ester/ethylenically unsaturated composition may be applied as a coating, via various standard coating techniques, to the substrate prior to curing of the cyanate and ethylenically unsaturated components. The ethylenically unsaturated component may then be cured by exposing the coating to energy in the form of heat or light, preferably light, to provide a curable PSA coating. The substrate is then bonded to a second substrate by the application of heat and pressure to provide the bonded article. It is preferred that the curable PSA be applied to the substrate at ambient temperature (15°–35° C.) but lower and higher temperatures may be used. The preferred curing temperature range for the cyanate ester component of the curable PSA, after two substrates have been initially bonded by the curable PSA, is from approximately 20° C. to 300° C. with a preferred range of 30°–200° C. and a most preferred range of 40°–150° C. Lower cure temperatures generally will require longer cure times than higher temperatures and cure times may range from a few seconds to several days depending upon the intended application for the curable PSA. For example, in bonding flex circuitry a bond time of 5–50 seconds at 150°–200° C. is desirable while in bonding automotive body panels to a frame a bond time of 30 minutes at 120° C., which are typical conditions used in automotive paint curing ovens, is acceptable.

Because both components of the compositions of the invention may be photocured, exposure of coatings to actinic radiation through an appropriate mask will lead to patterned coatings reflecting the image of the exposure mask. Exposure techniques useful in generating such images are well known to those skilled in the art. One or both components of the composition may be photocured during the imaging procedure. For subsequent use as an adhesive, it is desirable to cure only one component and thereby generate the image; the second component remains curable, preferably thermally, and this provides compositions which may be used to bond two surfaces by the application of heat and pressure. The ability to form imaged coatings of adhesive compositions is particularly useful where screen printing and other patterning methods may not be used due to resolution limits or surface topography. In the application of adhesives it is usually desirable to place the adhesive only on the areas of the substrate to be bonded. In electronics manufacture and similar areas, care in this regard is exercised due to the typically small sizes of the components to be bonded. It is to be appreciated that fine features on substrates to be bonded can be damaged or impaired by poorly positioned adhesive.

For use as a photoresist, solder mask, printing plate, protective coating, printed circuit pattern, and the like, it is desirable to cure both the ethylenically unsaturated monomer and the cyanate ester monomer in an imagewise manner. In this case, it is preferred that the curatives for the ethylenically unsaturated monomer and the cyanate ester monomer both be photoactivatable. Exposure of the coating through a mask cures the ethylenically unsaturated monomer in the image of the mask and forms active catalyst for cyanate ester curing in the areas struck by the actinic radiation. The imaged coating is then placed in an oven in the dark to cure the cyanate in the imaged areas and fix the image. Suitable oven temperatures for the cyanate cure range from 50° to 250° C. with 80°–150° C. being the preferred range. Alternatively, the coating may be irradiated through a mask with the coating being held at an elevated temperature (50°–250° C.) where curing of the cyanate will occur upon photoactivation of the cyanate ester curative. In either method, the imaged coating is then developed by washing with a suitable solvent to dissolve away the unimaged portions of the coating. Suitable solvents are typical organic solvents such as methanol, ethanol, isopropanol, methyl ethyl ketone, cyclohexanone, toluene, dichloromethane, tetrahydrofuran, ethyl acetate, and the like, and various mixtures thereof. The developed coating may be used as is or it can be subjected to a thermal post cure to develop the ultimate properties of the coating. Suitable post curing temperatures are generally higher than the temperatures used to fix the image and may range from 50°–300° C. with 100°–200° C. being preferred.

Objects and advantages of this invention are further illustrated by the following examples, but the particular materials and amounts thereof recited in these examples, as well as other conditions and details, should not be construed to unduly limit this invention.

In the examples Me=methyl, Ph=phenyl, Cp=cyclopentadienyl, Mes=mesitylene.

All syrups unless otherwise stated were made by adding 0.05% KB-1 by wt. to the monomer and exposed to 350 nm UV light. Partially polymerized syrups can be made as described in U.S. Pat. No. 4,330,590, col. 6, lines 32–38, which is incorporated herein by reference for these procedures. The syrup making device allows for constant stirring and rotation along with a $N_2$ purge bubbling through the mixture. The UV light is placed 20.3 cm (8 inches) from the center axis of the jar. Tests have shown that the amount of energy from the lights at this distance is 67 mJ/cm²min. The syrups had Brookfield viscosities from 1000 to 3000 cps.

EXAMPLES

Example 1

One part Quatrex-7187™ cyanate ester resin (Dow Chemical) was mixed with one part iso-bornyl acrylate (Sartomer Co.) syrup and one part iso-octyl acrylate (Sartomer Co.) to give stock resin A. Cyanate ester catalysts and free radical catalysts were added to aliquots of stock resin A as indicated in TABLE I, below. The aliquots were Meyer bar (#28) coated, 0.025 mm (1 mil) thick, onto a steel plate, 152×51×0.23 mm (6×2×0.009 inch), and the plate was cut into 51×9.5 mm (2×⅜ inch) test pieces. A second 51×9.5 mm (2×⅜ inch) steel plate was placed on top of the test piece and the sandwich construction was clamped with two paper clips. The pieces were cured at 105° C. for 2 minutes immediately followed by 10 minutes at 180° C. The resulting cured constrained layer samples were analyzed by dynamic mechanical analysis (DMA) in the flexure mode using a Seiko Instruments DMS 110 Rheometer using a 20 mm flexible fixture. The samples were processed in the Rheometer four times by ramping from ambient temperature to 300° C. at 5°/minute and quenching with cold $N_2$ gas. The temperature range of the tan δ peak in the 4th run above a value of 0.06 was considered to be a measure of the effective vibration damping capacity of the sample. The data is shown in TABLE I, below.

TABLE I

Vibration Damping Data (DMA)

| Sample | Organometallic[a] or conventional cyanate catalyst | Free radical[b] catalyst | Damping range[c] begin/end | Range |
|---|---|---|---|---|
| 1 | [CpFe(CO)₂]₂ | VR-110[d] | 1/277 | 276 |
| 2 | [Cp₂Fe]SbF₆ | VR-160[e] | 198/236 | 38 |
| 3 | [(Mes)₂Fe][SbF₆]₂ | VR-110 | 195/243 | 48 |
| 4 | MeCpMn(CO)₃ | VR-160 | −4/151 | 155 |
| 5 | Mn₂(CO)₁₀ | VR-160 | 26/82 | 56 |
|   |   |   | 206/254 | 48 |
| 6 | Zn octoate* | VR-110 | 17/60 | 43 |

[a] 0.5% bw of the cyanate resin
[b] 1.0% bw of the acrylate resin
[c] °C., tan δ > 0.06
[d] azobistrimethylpentane
[e] azo-t-butane
*comparative The data show that organometallic catalysts are superior to traditional cyanate curing catalysts in providing high temperature damping materials with wide effective damping ranges from cyanate/acrylate compositions. The differences in the shapes of the tan δ curves for the samples reflects differences in the morphologies of the cured compositions and demonstrates the ability to control morphology by catalyst selection. Samples 1 and 4 have broad tan δ peaks indicative of microheterogeneously phase separated compositions. Samples 2 and 3 have sharper tan δ peaks at high temperature which indicates domination by the cyanate phase. Sample 5 shows two tan δ peaks indicative of a phase separated system. Sample 6 shows a tan δ peak at low temperature indicating domination by the acrylate phase. The ability of the samples to survive several temperature ranges to 300° C. also demonstrates their high temperature stability.

Example 2

For samples 1 to 4, cyanate ester catalysts and free radical catalysts were added to aliquots of stock resin A (Example 1) as indicated in TABLE II, below.

Sample 5 was prepared by mixing 2 parts Quatrex 7187 cyanate ester with 1 part of IOA, prepolymerized to about 2000 cps viscosity, and 1 part of IBA, prepolymerized to about 2000 cps viscosity. This mixture was added to a catalyst solution comprised of 0.002 parts of [CpFe(CO)₂]₂ and 0.01 parts KB-1 dissolved in 0.01 parts of methyl sulfolane.

The mixtures were knife coated to a thickness of 0.1 mm (4 mils) between two silicone treated polyester release liners and irradiated for 5 minutes under a 350 nm bulb (GE F15T8-BLB, 15 watt), and release liners were removed to give a free standing film. The film was laminated between two steel plates, placed in the DMA flexure head, and analyzed as in Example 1. The data are shown in TABLE II, below.

TABLE II

Vibration Damping Data (DMA)

| Sample | Organometallic[a] or conventional cyanate catalyst | Free radical[b] catalyst | Damping range[c] begin/end | Range |
|---|---|---|---|---|
| 1 | [CpFe(CO)₂]₂[d] | KB-1[e] | 25/129 | 104 |
| 2 | [Cp₂Fe]SbF₆ | KB-1 | 12/39 | 27 |
| 3 | [(Mes)₂Fe][SbF₆]₂ | KB-1 | 24/78 | 54 |

TABLE II-continued

| | Vibration Damping Data (DMA) | | | |
|---|---|---|---|---|
| Sample | Organometallic[a] or conventional cyanate catalyst | Free radical[b] catalyst | Damping range[c] begin/end | Range |
| 4 | Zn octoate* | KB-1 | −5/20 | 25 |
| 5 | [(CpFe(CO)₂]₂[d] | KB-1 | 21/130 | 109 |

[a] 0.5% bw of the cyanate resin
[b] 1.0% bw of the acrylate resin
[c] °C., tan δ > 0.06
[d] 0.1 wt % of the cyanate resin
[e] benzildimethyl ketal
*comparative The data of this example show that free standing curable films may be prepared and the cyanate component does not interfere with the acrylate photocure. Photoprocessing of the organometallic samples causes the acrylate phase to dominate instead of the cyanate phase. The traditional Zn octoate catalyst does not provide such morphology control through process variables.

Compared to Example 1 the data of this example show that the morphology of the compositions of this invention can be controlled by the choice of processing conditions.

Example 3

Stock resin B was prepared by mixing 4 parts Dow Quatrex-7187 (cyanate ester), 3 parts iso-bornyl acrylate, and 1 part phenoxyethyl acrylate (Sartomer Co., Exton, Pa.). Cyanate ester catalysts and KB-1 photoinitiator were added to aliquots of resin B in the proportions shown in Table III. The aliquots were knife coated to a 0.04 mm (1.5 mil) thickness between silicone coated polypropylene films 0.05 mm thick (Toray) and irradiated for 8 minutes with two 8 watt Sylvania blacklights (350 nm) to give free standing films. The films were analyzed by DSC (ramped from ambient to 225° C. at 10° C. per minute) and the results are shown in TABLE III, below.

TABLE III

| | Differential Scanning Calorimetry | | | | |
|---|---|---|---|---|---|
| | Cyanate ester catalyst | | | DSC exotherm (°C.) | |
| Sample | (g) | KB-1 (g) | Resin B (g) | Onset | Peak |
| 1 | [CpFe(CO)₂]₂ (0.025)[a] | 0.051 | 5.00 | 94.5 | 130.5 |
| 2 | [Cp(xylenes)Fe]SbF₆ (0.027)[a] | 0.048 | 4.99 | 105.4 | 127.4 |
| 3 | [(Mes)₂Fe][SbF₆]₂ (0.025)[a] | 0.053 | 5.00 | 119.4 | 153.5 |
| 4 | [Cp₂Fe]SbF₆ (0.026)[a] | 0.049 | 4.95 | 99 | 177.3 |
| 5 | Zn naphthenate[b] (0.048)* | 0.055 | 4.98 | 109.2 | 156.4 |
| 6 | Co naphthenate[b] (0.053)* | 0.048 | 5.00 | 107.6 | 154.3 |
| 7 | Mn naphthenate[b] (0.053)* | 0.048 | 4.98 | 128 | 179.4 |
| 8 | Cu Acac[c] (0.085)* | 0.051 | 5.02 | 194.2 | --d-- |

[a] in 0.08 grams of methyl sulfolane
[b] in mineral spirits
[c] copper acetylacetonate in nonylphenol
[d] peak not observed
[e] no solvent
*comparative The data show that organometallic catalysts are effective curatives at lower loadings than traditional cyanate ester catalysts. Additionally, dispersants and co-solvents required with traditional cyanate ester catalysts are not required with the organometallic catalysts. The data also show the cyanate ester is thermosettable after acrylate photocuring and that organometallic catalysts, especially [CpFe(CO)₂]₂ and [CpFe(arene)]⁺, are the most active catalysts.

Example 4

The films prepared in Example 3 were used to prepare the constrained layer samples of TABLE IV, prepared as described in Example 2. The samples were analyzed by DMA as in Examples 1 and 2. In all cases, at least two distinct maxima were observed in the tan δ curves which is representative of phase separation. The portion of the tan δ curve above 0.045 was taken to be the vibration damping range for comparative purposes and the data are shown in TABLE IV, below.

TABLE IV

| | Vibration Damping Data (DMA) | | | |
|---|---|---|---|---|
| Sample | Organometallic catalyst or conventional cyanate catalyst | Damping range* begin/end (range) | Low temp max (°C./intensity) | High temp max (°C./intensity) |
| 1 | [CpFe(CO)₂]₂ | 130/230 (100) | 157/0.108 | 224/0.051 |
| 2 | [Cp(xylenes)Fe]SbF₆ | 140/240 (100) | 172/0.103 | 226/0.059 |
| 3 | [(Mes)₂Fe][SbF₆]2 | 128/180 (52) | 151/0.115 | 248/0.057 |
| 4 | [Cp₂Fe]SbF₆ | 140/190 (50) 220/240 (20) | 163/0.113 | 232/0.052 |
| 5 | Zn naphthenate* | 150/210 (60) | 171/0.111 | 275/0.035 |
| 6 | Co naphthenate* | 135/240 (105) | 158/0.118 | 223/0.052 |
| 7 | Mn naphthenate* | 136/300 (170) | 152/0.100 | 230/0.072 260/0.065 |
| 8 | Cu Acac* | 125/167 (42) | 146/0.109 | 234/0.028 |

(*) °C., tan δ > 0.045
*comparative

Compared with Example 2, the data of this example show that changing the acrylate composition can dramatically change physical properties of the cured materials even when the processing conditions are essentially the same.

Example 5

The films from Example 3 were used as a film adhesive to bond 2×2×1.25 mm glass test chips (cut from a microscope slide) to a microscope slide. A 10×10 mm piece of adhesive film (as provided in Example 3) was pre-tacked to the microscope slide and 4 test chips were simultaneously bonded to the adhesive covered area using at 180° C. and 4.22 Kg/cm² (60 psi) for 20 seconds using a vice with heated coplaner platens. The bonded chips were allowed to cool under pressure to 100° C. and were then removed from the bonder. The adhesion of the chips was analyzed using a die shear tester (Semiconductor Equipment Corp. Die Shear Tester Model 6000) and the data for average shear energy required to remove the chips is shown in TABLE V, below.

TABLE V

| | Shear Adhesion (Glass Chip) | |
|---|---|---|
| Sample | Cyanate ester catalyst | Shear to failure (g/mm²) |
| 1 | [CpFe(CO)₂]₂ | 661 |
| 2 | [Cp(xylenes)Fe]SbF₆ | 546 |
| 3 | [(Mes)₂Fe][SbF₆]₂ | 423 |
| 4 | [Cp₂Fe]SbF₆ | 411 |

TABLE V-continued

Shear Adhesion (Glass Chip)

| Sample | Cyanate ester catalyst | Shear to failure (g/mm$^2$) |
|---|---|---|
| 5 | Zn naphthenate* | 554 |
| 6 | Co naphthenate* | 535 |
| 7 | Mn naphthenate* | 414 |
| 8 | Cu Acac* | 397 |

*comparative

The data of TABLE V show that the dry adhesive films and organometallic catalysts for cyanate ester curing, especially [CpFe(CO)$_2$]$_2$, gave useful adhesion in chip bonding applications. Compared to data of Example 3, the data of TABLE V correlate with the DSC exotherms of the adhesive films. The organometallic samples, especially 1 and 2, could be used in chip bonding applications at bonding temperatures well below 180° C.

Example 6

A commercially available polyvinylbutyral (Butvar™, Monsanto Chemical Company, St. Louis, Mo.) co-polymer, 29 mol % vinyl alcohol, was converted to an acryloyloxy derivative by condensation of isocyanatoethylene methacrylate (IEMA) with the vinyl alcohol hydroxyl groups to the extent of 60%. Coatings of this polymer with various organometallic compounds were cast from solutions comprising 2 g polymer (20 wt % in tetrahydrofuran, THF) and 0.1 g of the organometallic. The coatings were spread on polyester film with a #40 Meyer Bar and oven dried (1 min at 80° C.). Samples were exposed to a medium pressure Hg source in a Berkey-Ascor vacuum frame through a square root of 2 step tablet (Stouffer Sensitivity Guide, Stouffer Graphic Arts Equipment Company, South Bend, Ind.), and immediately thereafter developed in isopropanol to reveal any negative resist image which may have been formed on the support by photocuring of the polymer. The data is shown in TABLE VI, below in which the result, e.g., "solid 1" means that the coating was completely insolubilized by exposures greater than or equal to that reaching the sample through step #1 of a step tablet.

TABLE VI

Acrylate Photoimaging

| Sample | Catalyst | Exposure time | Result |
|---|---|---|---|
| 1 | MeCpMn(CO)$_3$ | 2 min. | well defined resist; solid 1; "ghost" 2–3 |
| 2 | [CpFe(CO)$_2$]$_2$ | 2 min. | no image |
| 3 | [CpW(CO)$_3$]$_2$ | 2 min. | no image |
| 4 | CpFe(CO)$_2$SnPh$_3$ | 2 min. | no image |
| 5 | (C$_6$H$_6$)Cr(CO)$_3$ | 2 min. | well defined resist; solid 6, "ghost" 7 |
| 6 | none | 2 min. | no image |

The data show that neutral, mononuclear organometallic complexes containing polyene ligands and carbonyl ligands (samples nos. 1 and 5) are effective photocatalysts in free radical curing.

Example 7

A solution of acrylamide (1 g., Aldrich Chemical Co.) and MeCpMn(CO)$_3$ (0.10 g., Aldrich Chemical Co.) in tetrahydrofuran (1 ml) was prepared and irradiated in a quartz cuvette for 2 min in front of a medium pressure Hg arc lamp. Absorption spectroscopy revealed a new band in the irradiated solution centered on 425 nm; no further changes were observed in this irradiated solution when it was allowed to stand in the dark. A solution of similar composition, similarly irradiated, was purged with dry nitrogen and sealed to exclude air; when this deoxygenated solution was allowed to stand, sealed, in the dark for an additional 96 h, the acrylamide was completely converted to insoluble polymer and the characteristic yellow color of the photoproduct had disappeared.

This Example illustrates that the photoreaction generates the initiator for the subsequent air-inhibited polymerization.

Example 8

A monomer composition was prepared by mixing 5 parts Quatrex-7187 cyanate ester with 3 parts of an isobornyl acrylate partially polymerized syrup of 2870 cps viscosity and 2 parts of a 4000 cps viscosity partially polymerized syrup prepared from 9 parts isooctyl acrylate and 1 part tetrahydrofurfuryl acrylate monomers. The mixture was stirred and heated at 100° C. for 30 minutes and cooled with stirring to room temperature. One percent, by weight of the acrylate components, of (benzildimethyl ketal) KB-1 was dissolved into the mixture and the mixture was divided into to portions. In one portion, 0.5%, by weight of the cyanate component, of [CpFe(CO)$_2$]$_2$ was dissolved. In the other portion, 0.5%, by weight of the cyanate component, of zinc octoate (8% in mineral spirits) was dissolved. Both mixtures were coated to a 0.025 mm (0.001 inch) thickness between two silicone coated polyester release liners and photocured by exposing to the light from two GE F15T8/BLB bulbs for 5 minutes. The liners were removed and 25×25 mm (1×1 in) samples of the resulting adhesive films were laminated onto one end of several 25×152×0.30 mm (1×6×0.012 in) steel bars. These bars were placed in a 180° C. oven for various lengths of time ("precure time"), removed, and allowed to cool. A third piece of 25×25 mm (1×1 in) film, which had not been subjected to any heat treatment, was laminated between two steel bars which had been in the oven for equal periods of time such that the adhesive portions were placed on top of one another giving overlap shear test samples with three layers of adhesive film between the steel bars. These constructions were clamped with paper clips and placed in a 180° C. oven for time periods ("bond times") equal to the time periods of the first heat treatment. The samples were evaluated by overlap shear at room temperature in a standard moving crosshead load frame using a separation rate of 1.27 mm/min (0.05 inches/minute). The results are shown in TABLE VII and each entry is the average of the results for 3 individual overlap shear specimens.

TABLE VII

Overlap Shear Adhesion

| Precure time | Bond time | Shear values (g/mm$^2$) for | |
|---|---|---|---|
| (minutes at 180° C.) | | [CpFe(CO)$_2$]$_2$ | Zn octoate* |
| 0.5 | 0.5 | 298 | 379 |
| 1.0 | 1.0 | 517 | 314 |
| 2.0 | 2.0 | 790 | 269 |
| 4.0 | 4.0 | 778 | 217 |
| 5.0 | 5.0 | 623 | 242 |

*comparative

The data in TABLE VII show the compositions of this invention to be superior adhesives to those using conventional cyanate ester catalysts; the average of the shear values for the [CpFe(CO)$_2$]$_2$ samples (601 g/mm$^2$) is more than two times greater than the average of the shear values for the Zn octoate samples (284 g/mm$^2$). The data also show the beneficial effect of processing induced morphology changes by the increased shear values for the [CpFe(CO)$_2$]$_2$ samples with longer precure/bond times.

Example 9

Samples of the two adhesive films prepared in Example 8 were aged at room temperature for 24 hours and were then used to prepare overlap shear test specimens. The film prepared with Zn octoate was no longer tacky after aging while the film prepared with [CpFe(CO)$_2$]$_2$ remained tacky. The specimens were prepared and evaluated as in Example 8 and the results are shown in TABLE VIII.

TABLE VIII

Overlap Shear Adhesion

| Precure time | Bond time | Shear values (g/mm$^2$) for | |
|---|---|---|---|
| (minutes at 180° C.) | | [CpFe(CO)$_2$]$_2$ | Zn octoate* |
| 0.5 | 3.0 | 439 | 351 |
| 1.0 | 3.0 | 589 | 338 |
| 2.0 | 3.0 | 629 | 306 |
| 3.0 | 3.0 | 602 | 255 |

*comparative

The data in TABLE VIII show the adhesive films prepared with [CpFe(CO)$_2$]$_2$ maintain their superiority over those prepared with conventional cyanate ester catalysts even after aging of the films. The loss of tack with the films prepared with Zn octoate upon aging shows the superior shelf life of the adhesives prepared with organometallic cyanate ester catalysts.

Example 10

Adhesive film samples were prepared by ball milling cyanate ester with preformed acrylate syrups, catalysts, conductive particles, and coupling agents in the amounts shown in TABLE IX. The acrylate syrups were prepared by dissolving 1 milligram of benzildimethyl ketal (KB-1) in 100 grams of the acrylate monomer in a soda-lime glass vessel, purging the system with a nitrogen bubble for 20 minutes, and irradiating through the walls of the glass vessel for 5 minutes with the light from two 8 watt 350 nm lamps (Sylvania F8T5/350BL) while continuing the nitrogen purge. The compositions were knife coated to a 0.04 mm thickness between 0.08 mm conventional polypropylene release liners and irradiated for 10 minutes with the light from the 2 8 w 350 nm lamps to give the free standing adhesive films of TABLE IX.

TABLE IX

Formulations for Adhesive Films

| | Film* | | | | | |
|---|---|---|---|---|---|---|
| Component | A | B | C | D | E | F |
| Dimethyl acrylamide | 2.5 | — | — | — | 3.5 | — |
| Phenoxyethyl acrylate | 2.5 | — | 1.5 | 2.5 | 1.5 | — |
| N-vinylcaprolatam | — | 2.5 | — | — | — | — |
| N-butyl acrylamide | — | 2.5 | — | — | — | — |
| N-iso-butyoxymethyl | — | — | 3.5 | 2.5 | — | 5.0 |

TABLE IX-continued

Formulations for Adhesive Films

| | Film* | | | | | |
|---|---|---|---|---|---|---|
| Component | A | B | C | D | E | F |
| acrylamide | | | | | | |
| Quatrex-7187 cyanate ester | 5.0 | 5.0 | 5.0 | 5.0 | 5.0 | 5.0 |
| nickel particles[b] | 0.5 | 0.5 | 0.5 | 0.5 | 0.5 | 0.5 |
| KB-1 | 0.1 | 0.1 | 0.1 | 0.1 | 0.1 | 0.1 |
| [CpFe(CO)$_2$]$_2$ | 0.05 | 0.05 | 0.05 | 0.05 | 0.05 | 0.05 |
| 2-(3,4-epoxycyclohexyl)-ethyltrimethoxysilane | 0.1 | 0.1 | 0.1 | 0.1 | 0.1 | 0.1 |

([a]) amount in grams
([b]) Bell Pearl ™ (Kanebo, Japan), nickel on phenolic resin particles The data of this example show that free standing adhesive films containing a random dispersion of conductive particles can be prepared as 100% solids formulations using the compositions of the invention.

Example 11

Electrical resistance (4-wire) test samples were prepared by bonding flex circuitry (Au-metallized over 35 micrometer thick Cu traces on polyimide film from Minco Products Inc., Fridley, Minn.) to indium tin oxide (ITO) glass plates (20 Ω/square sheet resistivity from Nippon Sheet Glass, Japan) with the adhesive films of Example 10. Each flex circuit contained 17 traces of 0.2 mm width with 0.4 mm center-to-center spacings. Adhesives were first pretacked to the flex circuits by application of heat (100° C.) and gentle pressure (rubbing by hand with a cotton tipped wooden applicator) for 2–5 seconds. The bonds were made at 2 MPa for 20 seconds using a Unitek (Monrovia, Calif.) Phasemaster-4 hot-bar bonder with the thermode set to 300° C.; these bonding conditions heated the adhesive in the bond line to 180° C. A solid blade type thermode of 1.5 mm width was used. Electrical resistance of each adhesive interconnection was measured by the four-wire method using the principles described in ASTM B 539-90 such that the net resistance not due to the interconnection was minimized to approximately 150 mΩ. Measurements were made before and after 1000 hours of aging at 60° C. and 95% relative humidity. The results are shown in TABLE X.

TABLE X

Interconnection Resistance

| | Initial resistance[a] | | | Aged[b] resistance[a] | | |
|---|---|---|---|---|---|---|
| Film | Average | Minimum | Maximum | Average | Minimum | Maximum |
| A | 0.502 | 0.454 | 0.609 | 0.674 | 0.619 | 0.755 |
| B | 0.475 | 0.440 | 0.533 | 1.902 | 1.086 | 7.169 |
| C | 0.456 | 0.412 | 0.501 | 0.473 | 0.435 | 0.502 |
| D | 0.509 | 0.469 | 0.581 | 0.536 | 0.489 | 0.605 |
| E | 0.505 | 0.464 | 0.549 | 4.974 | 2.285 | 11.029 |
| F | 0.443 | 0.413 | 0.514 | 0.555 | 0.504 | 0.634 |

([a]) ohms
([b]) 1000 hours, 65° C., 95% RH

The data of this example show that all the adhesive films from Example 10 gave satisfactory interconnect resistance prior to thermal and humidity aging and that formulations containing N-iso-butoxymethyl acrylamide showed the best performance after aging.

Example 12

Peel adhesion test (90°) samples were prepared by bonding flex circuitry to ITO glass plates with the adhesive films of Example 10 using the bonding method of Example 11. A standard moving crosshead load frame was used to measure the 90° peel adhesion of the bonds with a 2.54 mm/min peel rate before and after 500 hours of aging at 60° C. and 95% relative humidity. The results are shown in TABLE XI and each entry is the average of 3 test specimens.

TABLE XI

| | 90° Peel Adhesion Data | |
|---|---|---|
| Film | Initial Peel[a] | Aged[b] Peel[a] |
| A | 98.6 | 71.7 |
| B | 286.3 | 36.8 |
| C | 425.0 | 321.0 |
| D | 261.1 | 243.9 |
| E | 118.3 | 81.9 |
| F | 527.0 | 320.3 |

[a]in gm/cm, average of three specimens
[b]500 hours, 65° C., 95% RH

The data of this example show that the adhesive films from Example 10 which do not contain dimethyl acrylamide gave satisfactory adhesion for microelectronic applications prior to thermal and humidity aging and that formulations containing N-iso-butoxymethyl acrylamide showed the best performance after aging.

Example 13

A solution for spin coating was prepared from 155 parts by weight (pbw) methyl ethyl ketone, B-30 cyanate ester (100 pbw), CN966H90™ acrylated urethane oligomer (100 pbw, from Sartomer Co.), KB-1 (1 pbw), and MeCpMn(CO)₃ (1 pbw). This was spun at 2000 rpm onto a 102 mm diameter, 0.5 mm thick silicon wafer which had been cleaned by washing with deionized water. The coated wafer was placed in a 50° C. oven for 15 minutes to drive off residual solvent and give a 9 micrometer thick coating. The dried wafer was laminated with a 0.05 mm thick silicone coated polyester release liner and was photoimaged through the liner in a JBA mask aligner/exposure unit (Jerry Bachur Associates, San Jose, Calif.) using a resolution mask. The JBA exposure unit was equipped with a collimated 500 watt mercury arc ultraviolet light source. The coating was exposed for 20 seconds at a light intensity of 15 milliwatts per cm² or 300 millijoules per cm² at a wavelength of 365 nm. The resolution mask was 152 mm by 152 mm chrome-on-glass mask. The photolithography pattern was a series of lines which were 121 mm long with widths ranging from 100 mils to 4 micrometers. The imaged wafer was then placed in a 120° C. oven for 30 minutes to fix the image. The image was developed by dissolving the unexposed regions by washing with a 1:1 mixture of acetone and iso-propyl alcohol. The imaged wafer was examined by optical microscopy to reveal a smooth coating with few bubbles or pinholes; unexposed areas 20 micron across were completely resolved (all organic matter had been removed by the developing step) and showed vertical side walls. Smaller features were visible, but were not completely resolved in the developing step. The imaged coating showed good adhesion to the silicon wafer. The data of this example show that the compositions of the present invention are suitable for photoresist and photolithographic applications.

Example 14

Three syrups of approximately 2000 cps were prepared independently from IOA, IBA, and a 1:1 mixture of IOA and IBA. Samples for DMA were prepared from each of the three syrups and of a fourth syrup of approximately 2000 cps comprising a 1:1 mixture of the independently prepolymerized IOA and IBA syrups by adding 0.5% by weight KB-1 to the syrups, pouring each of the four syrups into 50×6×1 mm molds, covering the molds with a conventional silicone/polyester substrate release liner and a quartz plate (approximately 5 mm thick), and exposing the molds to 350 nm light for 10 minutes to complete the polymerization. The samples were tested on a Seiko Tensile DMS 200 DMA using a 2° C./min. heating rate. The cured IOA syrup showed a single Tg at −46° C., 46° C., the cured IBA syrup showed a single Tg at −100° C., the cured syrup from the 1:1 mixture of IOA and IBA monomers showed a single Tg at 37° C., the cured sample from the 1:1 mixture of the IOA and IBA syrups showed two distinct Tgs at 4 and 91° C. The data is shown in TABLE XII below.

TABLE XII

| | Glass Transition Temperatures | | |
|---|---|---|---|
| | Composition[a] | Initiator added after partial polymerization | Glass Transition Temperatures (Tg °C.) |
| 1 | partially polymerized IOA (syrup A) | 0.5 wt percent KB-1 | −46 |
| 2 | partially polymerized IBA (syrup B) | 0.5 wt percent KB-1 | 100 |
| 3 | partially copolymerized IOA and IBA | 0.5 wt percent KB-1 | 37 |
| 4 | combination of syrups A and B | 0.5 wt percent KB-1 | 4 and 91 |

[a]each partially polymerized syrup was initiated by 0.05 wt percent KB-1

The data of Table XII show that the use of mixtures of syrups causes increased phase separation which is not obtained from the monomers alone.

Example 15

To 3 g cyanate ester monomer L-10 (Ciba-Geigy) and 2 g isobornyl acrylate was added 0.05 g MeCpMn(CO)₃ (Aldrich Chemical Co., Milwaukee, Wis.). The resulting mixture was coated on 0.075 mm (3 mil) polyester film using a #40 Meyer bar. For ease of handling the coating was overlaid with 0.050 mm (2 mil) polypropylene film. A sample of this coating was exposed through the polypropylene cover sheet for 105 sec in a Berkey-Ascor graphic arts vacuum frame. During exposure the nearly colorless coating quickly became straw colored, then took on a gray cast. At the same time gas evolution from the still fluid coating was apparent, especially around the edges of the sample. At conclusion of the exposure, the cover sheet was removed to leave a greasy, but not readily flowing film on the polyester support.

The sample was subsequently heated 25 mm from the nozzle of a hot air blower (about 95° C.) long enough (about 15 seconds) to discharge the color of the coating, thought to be due to formation of complexes intermediate in the curing reaction, and to anneal out the bubble pattern resulting from gas evolution during irradiation. The resulting coating was uniform and non-flowing, though slightly tacky. Unlike the coating obtained on UV treatment alone, it was not removed from the support by ethanol sprayed from a wash bottle.

Similar heat treatment of coatings produced as above but with 45 sec and 5 min irradiation times yielded like results.

Final coatings, however, were progressively harder, e.g., more resistant to fingerprinting, with increasing UV exposure.

These results show that neutral, mononuclear organometallic complexes containing polyene and carbonyl ligands are useful as the sole catalyst in curing cyanate ester-ethylenically unsaturated monomer compositions.

Various modifications and alterations of this invention will become apparent to those skilled in the art without departing from the scope and spirit of this invention, and it should be understood that this invention is not to be unduly limited to the illustrative embodiments set forth herein.

We claim:

1. A composition of matter comprising a curable mixture comprising 1 to 99 weight percent of a first monomer and an initiator therefor, the first monomer being one of 1) at least one ethylenically unsaturated monomer or 2) at least one cyanate ester monomer, and 99 to 1 weight percent of a second monomer and an initiator therefor, the second monomer being the member of 1) or 2) that is not selected as the first monomer, wherein a curative for the cyanate ester is a transition metal-containing organometallic compound curing agent and a curative for the ethylenically unsaturated monomer is a free-radical generating curing agent or a transition metal-containing organometallic compound, said composition when one or more of said monomers has at least commenced curing comprises one or both of an interpenetrating polymer network and a semi-interpenetrating polymer network, said networks comprising a semi-phase separated morphology which includes a continuum of phase compositions.

2. The composition according to claim 1 wherein said ethylenically unsaturated monomer is selected from the group consisting of acrylates and methacrylate monomers.

3. The composition according to claim 1 wherein said cyanate ester monomer has the formula $$Q(OCN)_p \qquad \text{II}$$

wherein Q comprises at least one of 1) an aromatic hydrocarbon di-, tri-, or tetra-radical containing from 5 to 30 carbon atoms, wherein 1) optionally comprises at least one of (a) one to five aliphatic or polycyclic aliphatic divalent hydrocarbon groups containing 7 to 20 carbon atoms and (b) zero to 10 heteroatoms, and 2) divalent fluorocarbon group having 3 to 12,500 carbon atoms and 5 to 25,000 fluorine atoms, and p is an integer in the range of 2 to 7.

4. The composition according to claim 3 further comprising at least one monofunctional cyanate compound of formula QOCN, wherein Q is as defined in claim 3.

5. The composition according to claim 1 wherein said organometallic compound has the formula $$\{L^1 L^2 L^3 M\}^{+e} X_f$$

wherein $L^1$ represents none, or 1 to 12 ligands contributing pi-electrons that can be the same or different selected from the group consisting of a) acyclic unsaturated and cyclic unsaturated compounds and groups, b) carbocyclic aromatic compounds and groups, and c) heterocyclic aromatic compounds and groups, each capable of contributing 2 to 24 pi-electrons to file valence shell of M;

$L^2$ represents none, or 1 to 24 ligands that can be the same or different contributing an even number of sigma-electrons that are selected from mono-, di-, and tri-dentate ligands, each donating 2, 4, or 6 sigma-electrons to the valence shell of M;

$L^3$ represents none, or 1 to 12 ligands that can be the same or different, each contributing no more than one sigma-electron each to the valence shell of each M;

M represents 1 to 6 of the same or different racial atoms selected from the group consisting of the elements of Periodic Groups IVB, VB, VIB, VIIB, and VIII;

e is an integer having a value of 0, 1 or 2, such that the organometallic portion of the molecule is neutral, cationic or dicationic;

each X is selected from the group consisting of organic sulfonates, halogenated metals or metalloids, and alkylated or arylated metal or metalloid; and p-toluenesulfonate, p-chlorobenzenesulfonate, $BF_4^-$, $PF_6^-$, $AsF_6^-$, $SbF_6^-$, $FeCl_4^-$, $SnCl_5^-$, $SbF_5^-$, $AlF_6^-$, $GaCl_4^{31}$ 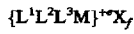, $InF_4^-$, $TiF_6^-$, $CH_3SO_3^-$, $B(C_6H_5)_4^-$, $C_6H_5SO_3^-$, $CF_3SO_3^-$, $SbF_5OH^-$, and $SbCl_6^-$;

f is an integer of 0, 1 or 2, the number of anions required to balance the charge e on the organometallic portion;

with the proviso that the organometallic compound contains at least one transition metal-carbon bond; and with the proviso that $L^1$, $L^2$, $L^3$, M, c, X, and f are chosen so as to achieve a stable configuration.

6. The composition according to claim 5 wherein X is a tetraalkyl or tetraaryl borate.

7. The composition according to claim 5 wherein X is selected from the group consisting of $BF_4^-$, $PF_6^-$, $AsF_6^-$, $SbF_6^-$, $B(C_6H_5)_4^-$, $CF_3SO_3^-$, and $SbF_5OH^-$.

8. The composition according to claim 1 wherein said initiators are independently thermally or photochemically initiated in any combination and in any order to provide a polymeric mixture.

9. The composition according to claim 1 wherein said ethylenically unsaturated monomer is present in the range of 70 to 30 weight percent and said at least one cyanate ester monomer is present in the range of 30 to 70 weight percent.

10. The composition according to claim 1 wherein said ethylenically unsaturated monomer is present in the range of 60 to 40 weight percent and said at least one cyanate ester monomer is present in the range of 40 to 60 weight percent.

11. The polymeric mixture according to claim 8.

12. A process for providing a mixture of polymerized cyanate ester monomer and polymerized ethylenically unsaturated monomer comprising the steps of a) providing a polymerizable admixture by adding in any order at least one cyanate ester monomer, at least one ethylenically unsaturated monomer, a catalytically effective amount of a cyanate ester curing agent comprising a transition metal-containing organometallic compound and a catalytically effective amount of a free-radical curing agent comprising an organic compound capable of generating free radicals, and b) allowing the mixture to polymerize or adding energy to the mixture to effect polymerization so as to provide a composition comprising one or both of an interpenetrating polymer network and a semi-interpenetrating polymer network, said networks comprising a semi-phase separated morphology which includes a continuum of phase compositions.

13. The method according to claim 12 wherein said curing agents are activated by energy in a simultaneous manner or in a sequential manner.

14. The method according to claim 13 wherein said simultaneous or sequential activation of said catalyst is by at least one of heat and light.

15. The method according to claim 12 further comprising one or both of steps a) and b):
   a) prepolymerizing at least one of said ethylenically unsaturated monomers to produce a syrup in which said monomer(s) has at least commenced polymerization, and
   b) prepolymerizing at least one of said cyanate ester monomers to produce an oligomer in which said monomer(s) has at least commenced polymerization.

16. The method according to claim 12 wherein said admixture further comprises at least one bireactive crosslinking monomer.

17. The method according to claim 12 wherein said polymerization is controlled by at least one of rate of polymerization and diffusion of each component monomer to provide at least one of a phase separated or a phase mixed morphology.

18. A curable adhesive composition comprising an admixture comprising
   1 to 99 weight percent of a first monomer and an initiator therefor, the first monomer being one of 1) at least one ethylenically unsaturated polymerizable monomer and 2) at least one cyanate ester monomer, and 99 to 1 weight percent of a second monomer and an initiator therefor, the second monomer being the member of 1) and 2) that is not selected as the first monomer, when the curing agent for said cyanate ester is a transition metal containing organometallic compound and the curing agent for said free-radically polymerizable monomer is a free-radical generating curing agent, said composition when at least partially cured comprising one or both of an interpenetrating polymer network and a semi-interpenetrating polymer network, said networks comprising a semi-phase separated morphology which includes a continuum of phase compositions.

19. The composition according to claim 18 wherein at least one of said ethylenically unsaturated monomers is polymerized prior to polymerization of said at least one cyanate ester monomer.

20. The composition according to claim 19 which is an electronic adhesive.

21. A curable composition comprising an admixture comprising
   1 to 99 weight percent of a first monomer and an initiator therefor, the first monomer being one of 1) at least one free-radically polymerizable monomer and 2) at least one cyanate ester monomer, and 99 to 1 weight percent of a second monomer and an initiator therefor, the second monomer being the member of 1) and 2) that is not selected as the first monomer, wherein the curing agent for said cyanate ester is a transition metal containing organometallic compound and the curing agent for said free-radically polymerizable monomer is a free-radical generating curing agent, said curable composition being a photoresist, said composition when cured comprising one or both of an interpenetrating polymer network and a semi-interpenetrating polymer network, said networks comprising a semi-phase separated morphology which includes a continuum of phase compositions.

22. The cured composition according to claim 1.

23. The composition according to claim 5 wherein any of said $L^1$ ligands are substituted by a species selected from the group consisting of alkyl, alkoxy, aryl, phenyl, halo, cyano, and nitro groups.

* * * * *